(12) United States Patent
Sekito

(10) Patent No.: US 9,458,279 B2
(45) Date of Patent: Oct. 4, 2016

(54) RESIN COMPOSITION AND USE THEREOF

(75) Inventor: Yoshihide Sekito, Shiga (JP)

(73) Assignee: KANEKA CORPORATION, Osaka (JP)

(*) Notice: Subject to any disclaimer, the term of this patent is extended or adjusted under 35 U.S.C. 154(b) by 279 days.

(21) Appl. No.: 12/993,721

(22) PCT Filed: May 14, 2009

(86) PCT No.: PCT/JP2009/058975
§ 371 (c)(1),
(2), (4) Date: Nov. 19, 2010

(87) PCT Pub. No.: WO2009/147938
PCT Pub. Date: Dec. 10, 2009

(65) Prior Publication Data
US 2011/0061915 A1    Mar. 17, 2011

(30) Foreign Application Priority Data

Jun. 2, 2008  (JP) ................. 2008-144983

(51) Int. Cl.
*C08G 18/75* (2006.01)
*C08G 18/34* (2006.01)
(Continued)

(52) U.S. Cl.
CPC ........... *C08G 18/758* (2013.01); *C08G 18/348* (2013.01); *C08G 18/44* (2013.01);
(Continued)

(58) Field of Classification Search
CPC ........... C08G 18/6659; C08G 18/348; C08G 73/1035
USPC ....................................... 525/454
See application file for complete search history.

(56) References Cited

U.S. PATENT DOCUMENTS 4,124,568 A * 11/1978 Zecher et al. ................. 528/59
6,335,417 B1    1/2002 Orikabe et al.
(Continued)

FOREIGN PATENT DOCUMENTS

JP    61-162525 A    7/1986
JP    10-316855 A    12/1998
(Continued)

OTHER PUBLICATIONS

Notification of Transmittal of Translation of the International Preliminary Report on Patentability (Form PCT/IB/338) of International Application No. PCT/JP2009/058975 mailed Jan. 20, 2011 with Forms PCT/IB/373 and PCT/ISA/237.
(Continued)

*Primary Examiner* — Mike M Dollinger
(74) *Attorney, Agent, or Firm* — Westerman, Hattori, Daniels & Adrian, LLP

(57) ABSTRACT

An object of the present invention is to provide: a (a) thermosetting resin composition, a photosensitive resin composition, a resin composition solution, a resin film, and an insulating film, each of which (i) is curable at a low temperature (not more than 200° C.), (ii) has excellent flexibility, electrical insulating reliability, solder heat resistance, and resistance to organic solvent, (iii) causes less warpage of a substrate after curing, and (iv) has excellent adhesiveness to a sealing agent; and a (b) printed wiring board provided with the insulating film mentioned above. The object of the present invention is attainable by using a thermosetting resin composition containing at least a (A) urethane imide oligomer having a terminal carboxylic acid group and a (B) thermosetting resin.

12 Claims, 1 Drawing Sheet

(51) Int. Cl.

| | | |
|---|---|---|
| *C08G 18/44* | (2006.01) | |
| *C08G 18/66* | (2006.01) | |
| *C08G 73/10* | (2006.01) | |
| *C09D 179/08* | (2006.01) | |
| *G03F 7/027* | (2006.01) | |
| *G03F 7/037* | (2006.01) | |
| *H01B 3/30* | (2006.01) | |
| *H01B 3/40* | (2006.01) | |
| *H05K 3/28* | (2006.01) | |

(52) U.S. Cl.
CPC ....... *C08G18/6659* (2013.01); *C08G 73/1035* (2013.01); *C09D 179/08* (2013.01); *G03F 7/027* (2013.01); *G03F 7/037* (2013.01); *H01B 3/306* (2013.01); *H01B 3/40* (2013.01); *H05K 3/287* (2013.01)

(56) References Cited

U.S. PATENT DOCUMENTS

| | | | |
|---|---|---|---|
| 7,239,030 B2* | 7/2007 | Naiki et al. | 257/792 |
| 2003/0130475 A1* | 7/2003 | Ichinose et al. | 528/171 |
| 2003/0149222 A1 | 8/2003 | Ichinose et al. | |
| 2004/0132888 A1 | 7/2004 | Naiki et al. | |
| 2006/0091548 A1* | 5/2006 | Naiki et al. | 257/753 |
| 2009/0092748 A1 | 4/2009 | Naiki et al. | |
| 2010/0084171 A1 | 4/2010 | Fujihara et al. | |
| 2010/0113689 A1 | 5/2010 | Naiki et al. | |
| 2010/0132989 A1* | 6/2010 | Fujihara et al. | 174/258 |

FOREIGN PATENT DOCUMENTS

| | | |
|---|---|---|
| JP | 11-199669 A | 7/1999 |
| JP | 11-209609 A | 8/1999 |
| JP | 11-217502 A | 8/1999 |
| JP | 2000-212446 A | 8/2000 |
| JP | 2000-234023 A | 8/2000 |
| JP | 2000-319389 A | 11/2000 |
| JP | 2000-319391 A | 11/2000 |
| JP | 2001-031764 A | 2/2001 |
| JP | 2001-089656 A | 4/2001 |
| JP | 2001-125273 A | 5/2001 |
| JP | 2001-163974 A | 6/2001 |
| JP | 2001-215702 A | 8/2001 |
| JP | 2001-302747 A | 10/2001 |
| JP | 2001-316469 A | 11/2001 |
| JP | 2002-097270 A | 4/2002 |
| JP | 2002-371182 A | 12/2002 |
| JP | 2004-211064 A | 7/2004 |
| JP | 2004-240267 A | 8/2004 |
| JP | 2005-220339 A | 8/2005 |
| JP | 2006-096825 A | 4/2006 |
| JP | 2006-152017 A | 6/2006 |
| JP | 2006-307183 A | 11/2006 |
| JP | 2007-016097 A | 1/2007 |
| JP | 2008-120954 A | 5/2008 |
| JP | 2008-255249 A | 10/2008 |
| WO | 2008/078620 A1 | 7/2008 |
| WO | 2008/132960 A1 | 11/2008 |
| WO | WO 2008132960 A1 * | 11/2008 |

OTHER PUBLICATIONS

International Search Report of PCT/JP2009/058975, mailing date Jul. 7, 2009.
Advisory Action dated Nov. 30, 2012, issued in U.S. Appl. No. 12/596,027.
Restriction Requirement dated Oct. 20, 2011, issued in U.S. Appl. No. 12/596,027.
Office Action dated Dec. 7, 2011, issued in U.S. Appl. No. 12/596,027.
Final Office Action dated Jun. 26, 2012, issued in U.S. Appl. No. 12/596,027.
International Search Report of PCT/JP2008/056701, mailing date Jul. 1, 2008.
Translation of the International Preliminary Report on Patentability (PCT/ISA/237) (6 pages), (PCT/IB/373) (1 page) of International Application No. PCT/JP2008/056701 mailed Oct. 29, 2009, (Form PCT/IB/326) (1 page).
U.S. Office Action dated Jun. 28, 2013, issued in corresponding U.S. Appl. No. 12/596,027.
U.S. Office Action dated May 8, 2014, issued in co-pending U.S. Appl. No. 12/596,027 (15 pages).

* cited by examiner

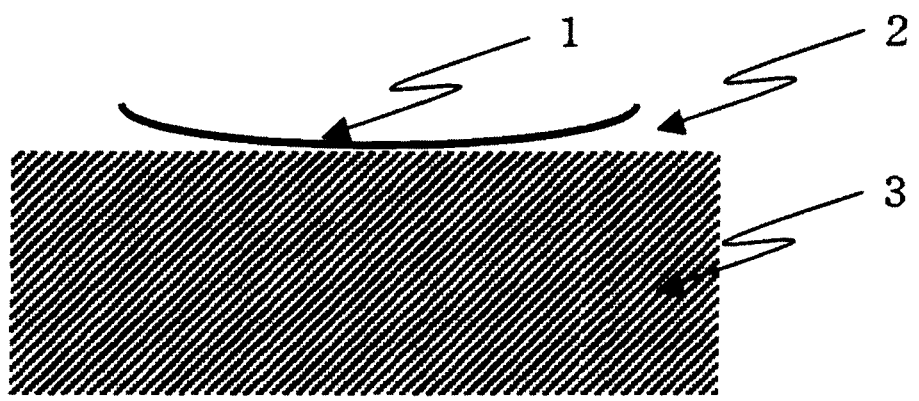

RESIN COMPOSITION AND USE THEREOF

TECHNICAL FIELD

The present invention relates to (i) a thermosetting resin composition which is curable at a low temperature and which can be preferably used as an insulating material for electric and electronic purposes, (ii) a photosensitive resin composition which is curable at a low temperature, which can be preferably used as an insulating material for electric and electronic purposes, and which can be developed by an alkaline aqueous solution, (iii) a cured film and an insulating film obtainable from the thermosetting resin composition or the photosensitive resin composition, and (iv) a printed wiring board provided with the insulating film.

BACKGROUND ART

Polyimide resin has excellent heat resistance, an excellent electrical insulating property, excellent chemical resistance, and a mechanical property, and therefore is used for electric and electronic purposes. For example, the polyimide resin is used as materials of (i) an isolation film and a protective coating agent provided on a semiconductor device, (ii) a surface protective material and a base material resin for a flexible circuit substrate, an integrated circuit, and the like, and (iii) an interlayer insulating film and a protective film for a fine circuit. Particularly, in a case where the polyimide resin is used as a coating material for wiring lines on a substrate, the polyimide resin is used in a form of, for example: a cover lay film that is obtained by applying an adhesive agent on a shaped product such as a polyimide film; or a liquid cover coat ink made from the polyimide resin and the like.

As the polyimide resin solution used as the liquid cover coat ink, there have been proposed, for example, a polyimide resin soluble in an organic solvent and a polyimide resin composition using a thermosetting resin such as epoxy resin (see, for example, Patent Literatures 1 to 4).

Further, there has been proposed a curable imide resin composition in which a low-molecular-weight amide-imide resin having a carboxyl group and/or a low-molecular-weight imide resin having a carboxyl group, and an epoxy resin are dissolved (for example, see Patent Literature 5).

Further, there has been proposed a curable resin composition containing an epoxy resin and an imide oligomer having an acid anhydride group at its terminal, which imide oligomer is obtainable from an asymmetric aromatic or cycloaliphatic tetracarboxylic acid dianhydride and diamino polysiloxane (for example, see Patent Literature 6).

CITATION LIST

Patent Literature 1
Japanese Patent Application Publication, Tokukaihei, No. 11-199669 A (1999)
Patent Literature 2
Japanese Patent Application Publication, Tokukai, No. 2002-371182 A
Patent Literature 3
Japanese Patent Application Publication, Tokukai, No. 2005-220339 A
Patent Literature 4
Japanese Patent Application Publication, Tokukai, No. 2006-96825 A
Patent Literature 5
Japanese Patent Application Publication, Tokukai, No. 2001-316469 A
Patent Literature 6
Japanese Patent Application Publication, Tokukai, No. 2002-97270 A

SUMMARY OF INVENTION

Technical Problem

However, the polyimide resin composition disclosed in any of Patent Literatures 1 to 4 is a polymer solution having a high molecular weight, a high solute molecular weight, and low solubility in solvent. Therefore, it is difficult to prepare a solution thereof to have a high solute concentration, and further it is necessary to volatile a solvent largely to form a coating film therefrom, for example. This makes it difficult to form the coating film in a uniform thickness, thereby decreasing productivity. Further, in a case where the polyimide resin composition contains a crosslinking agent, only slight reaction of a polymer having a high molecular weight with the crosslinking agent in the composition increases the viscosity of an obtainable solution significantly. Consequently, the resultant polyimide resin composition solution has poor stability in viscosity and is easily gelatinized.

As for the curable imide resin composition, disclosed in Patent Literature 5, in which composition an epoxy resin and a low-molecular-weight amide-imide resin having a carboxyl group and/or a low-molecular-weight imide resin having a carboxyl group are dissolved, the epoxy resin and a terminal carboxyl group in an oligomer having no flexible skeleton are reacted with each other. This causes a cross-link density to be very high and an obtainable cured film to be hard and fragile. For example, in a case where the curable imide resin composition is used as an insulating protective film provided on a flexible base material (for example, a flexible printed wiring board), which is required to have a flexing property, the insulating protective film is cracked when the printed wiring board is bended. Further, in this case, there arises such a problem that when an applied film of the curable imide resin composition is cured by heating, the printed wiring board is warped due to the heating.

The curable resin composition, disclosed in Patent Literature 6, which contains an epoxy resin and an imide oligomer having an acid anhydride group at its terminal, which imide oligomer is obtained from an asymmetric aromatic or cycloaliphatic tetracarboxylic acid dianhydride and a diamino polysiloxane, has, at its terminal, an acid anhydride group that is active at a room temperature. Therefore, a reaction between the acid anhydride group and the epoxy resin gradually proceeds, thereby increasing the viscosity of a solution of the curable resin composition. Thus, the curable resin composition has poor stability in viscosity. Further, in a case where a cured film obtained by curing the curable resin composition is used, for example, as a circuit board material, impurities contained in the diamino polysiloxane bleed out from the cured film, thereby causing malfunction of a semiconductor. Further, the cured film has a surface that is poor in wettability, which renders its adhesiveness to various sealing agents poor.

The present invention is accomplished in view of the above problems. An object of the present invention is to provide: (i) a thermosetting resin composition, a photosensitive resin composition, a resin composition solution, a resin film, and an insulating film, each of which is curable at a low temperature (not more than 200° C.), has excellent flexibility, electrical insulating reliability, solder heat resistance, and resistance to organic solvent, hardly causes a curve of a substrate after being cured, and has excellent adhesiveness to a sealing agent; and (ii) a printed wiring board provided with the insulating film.

Solution to Problem

Inventors of the present invention studied diligently to achieve the object. As a result of the diligent study, they found a fact that with the use of a composition containing at least a (A) urethane imide oligomer having a terminal carboxylic acid group and a (B) thermosetting resin, it is possible to form a cured film (i) which is curable at a low temperature (not more than 200° C.), (ii) which has excellent flexibility, electrical insulating reliability, solder heat resistance, and resistance to organic solvent, (iii) which causes less warpage of a substrate after being cured, and (iv) which has excellent adhesiveness to a sealing agent. That is, a resin composition solution containing a (A) urethane imide oligomer having a terminal carboxylic acid group and a (B) thermosetting resin exhibits low viscosity even though the solution is prepared to have a high concentration of solute dissolved therein. In addition, the inventors found that with the use of the solution, it is possible to form a cured film having various excellent physical properties. Based on these facts, the inventors accomplished the present invention. The present invention can attain the above object by a resin composition having a novel structure as described below.

That is, a thermosetting resin composition according to the present invention contains at least: a (A) urethane imide oligomer having a terminal carboxylic acid group; and a (B) thermosetting resin.

In the thermosetting resin composition according to the present invention, it is preferable that the (A) urethane imide oligomer having a terminal carboxylic acid group be a tetracarboxylic acid urethane imide oligomer.

Further, in the thermosetting resin composition of the present invention, it is preferable that the (A) urethane imide oligomer having a terminal carboxylic acid group be obtained by (i) reacting at least a (a) diol compound and a (b) diisocyanate compound so as to synthesize a terminal isocyanate compound, (ii) reacting the terminal isocyanate compound with a (c) tetracarboxylic acid dianhydride so as to synthesize a urethane imide oligomer having a terminal acid anhydride, and (iii) reacting the urethane imide oligomer having a terminal acid anhydride with (d) water and/or primary alcohol, the (a) diol compound being represented by General Formula (1):

[Chem. 1]

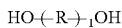

HO—(—R—)$_l$—OH    (1)

(wherein R represents a divalent organic group; and l represents an integer of 1 to 20), the (b) diisocyanate compound being represented by General Formula (2):

[Chem. 2]

O═C═N—X—N═C═O    (2)

(wherein X represents a divalent organic group), and the (c) tetracarboxylic acid dianhydride being represented by General Formula (3):

[Chem. 3]

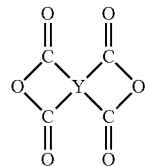

(3)

(wherein Y represents a tetravalent organic group).

Further, in the thermosetting resin composition according to the present invention, it is preferable that the (a) diol compound contain at least a polycarbonate diol represented by General Formula (4):

[Chem. 4]

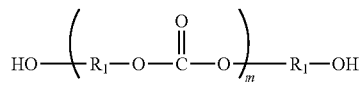

(4)

wherein each $R_1$ independently represents a divalent organic group; and m represents an integer of 1 to 20.

Moreover, in the thermosetting resin composition according to the present invention, it is preferable that the (A) urethane imide oligomer having a terminal carboxylic acid group further have a carboxyl group in its side chain.

In the thermosetting resin composition according to the present invention, it is preferable that the (B) thermosetting resin be contained in the thermosetting resin composition by 1 to 100 parts by weight, relative to 100 parts by weight of the (A) urethane imide oligomer having a terminal carboxylic acid group.

A photosensitive resin composition according to the present invention contains at least: any of the aforementioned thermosetting resin compositions; and a (C) photosensitive resin; and a (D) photopolymerization initiator.

In the photosensitive resin composition according to the present invention, it is preferable that the (A) urethane imide oligomer having a terminal carboxylic acid group, the (B) thermosetting resin, the (C) photosensitive resin, and the (D) photopolymerization initiator be contained in the photosensitive resin composition in such an amount ratio that the (C) photosensitive resin and the (D) photopolymerization initiator are contained therein respectively by 10 to 200 parts by weight and by 0.1 to 50 parts by weight, relative to 100 parts by weight of a total solid content of the (A) urethane imide oligomer having a terminal carboxylic acid group and the (B) thermosetting resin.

A resin composition solution according to the present invention is obtained by dissolving, in an organic solvent, any of the aforementioned thermosetting resin composition or any of the aforementioned photosensitive resin composition.

A resin film according to the present invention is obtained by applying, to a surface of a base material, the resin composition solution and then drying the resin composition solution thus applied.

An insulating film according to the present invention is obtained by curing the resin film.

A printed wiring board provided with an insulating film, according to the present invention is arranged such that the insulating film is the aforementioned insulating film; and the printed wiring board is covered with the insulating film.

Advantageous Effects of Invention

As described above, the thermosetting resin composition of the present invention contains at least a (A) urethane imide oligomer having a terminal carboxylic acid group and a (B) thermosetting resin. With the arrangement, when the thermosetting resin composition is dissolved in an organic solvent, a resultant thermosetting resin composition solution has a low viscosity despite having a high concentration of solute dissolved therein. Further, a cured film obtained from the thermosetting resin composition of the present invention is excellent in adhesiveness of a coating film, stability in environmental resistance test, chemical resistance, flexibility, and wettability of a coating film, and has excellent physical properties. In view of this, the thermosetting resin composition of the present invention is applicable as a protective film or the like provided on various circuit boards and yields distinguished effects. Further, the photosensitive resin composition of the present invention using the thermosetting resin composition is curable at a low temperature without using siloxane diamine, and exhibits various excellent properties when it is applied on a wiring board and formed into a shaped product.

BRIEF DESCRIPTION OF DRAWINGS

FIG. 1 is a schematic view of measuring how much a film is warped.

DESCRIPTION OF EMBODIMENTS

The following describes the present invention more specifically.

(I) Thermosetting Resin Composition

A thermosetting resin composition of the present invention contains at least a (A) urethane imide oligomer having a terminal carboxylic acid group and a (B) thermosetting resin.

The (A) urethane imide oligomer having a terminal carboxylic acid group in the thermosetting resin composition of the present invention is more preferably a urethane imide oligomer having a terminal tetracarboxylic acid group, which urethane imide oligomer is obtainable by use of a polycarbonate diol, but is not limited to this.

The inventors of the present invention found that the thermosetting resin composition of the present invention containing at least the (A) urethane imide oligomer having a terminal carboxylic acid group and the (B) thermosetting resin has various excellent properties. The presumable reason thereof is as follows.

That is, since the (A) urethane imide oligomer having a terminal carboxylic acid group is an oligomer having an imide skeleton and a urethane bond in a molecular, the (A) urethane imide oligomer is significantly excellent in solubility in organic solvent. Besides, in a case where a crosslinking agent is mixed therewith and a resultant solution is left for stand at a room temperature, even if the crosslinking agent is slightly reacted with the oligomer, the solution still maintains a molecular weight falling within an oligomer range. Accordingly, a thermosetting resin composition solution having excellent stability in viscosity at a room temperature can be obtained.

Further, a cured film containing the (A) urethane imide oligomer having a terminal carboxylic acid group is excellent in (i) heat resistance, electrical insulating reliability, and flame resistance, each derived from the imide skeleton, and (ii) chemical resistance and flexibility, each derived from the urethane bond. Particularly, as for the urethane imide oligomer having a terminal tetracarboxylic acid group, prepared by use of a polycarbonate diol, a cured film obtained therefrom surprisingly has hydrolysis resistance derived from a polycarbonate skeleton. Therefore, the cured film can restrain hydrolysis of the urethane bond at a high temperature and a high humidity, and thus exhibits excellent hydrolysis resistance.

When the carboxyl group contained in the (A) urethane imide oligomer having a terminal carboxylic acid group is heated, the carboxyl group is reacted with the (B) thermosetting resin, thereby causing three-dimensional crosslinking and increasing the molecular weight of a resultant thermosetting resin composition. Particularly, in a case where the terminal carboxylic acid is a tetracarboxylic acid, mixing of the (A) urethane imide oligomer with the (B) thermosetting resin at a room temperature produces a thermosetting resin composition solution having a very stable viscosity, and the reaction between the carboxylic acid and the thermosetting resin causes no increase in viscosity. This is because the activity of the tetracarboxylic acid is stabilized to be low at the room temperature. Note that the reaction between the (A) urethane imide oligomer having a terminal carboxylic acid group and the (B) thermosetting resin as the crosslinking agent is promoted at a temperature of not more than 200° C., more specifically, around 160 to 170° C. The reason is as follows: Due to (i) the urethane bond included in the urethane imide oligomer having a terminal carboxylic acid group, (ii) the flexibility derived from a diol component as a raw material, and (iii) high mobility of a molecular skeleton because of a low molecular weight, molecules actively move even at a curing temperature of around 160 to 170° C. This causes the terminal carboxyl group to collide with the crosslinking agent sufficiently. As a result, the increase in the molecular weight proceeds while three-dimensional cross-linkage is formed.

Further, the thermosetting resin composition of the present invention has no siloxane skeleton in the molecular skeleton. Therefore, a resultant cured film has a surface having good wettability and markedly excels in adhesiveness to various members. Besides, the cured film does not cause bleedout of impurities derived from a siloxane component. On this account, in a case where the cured film is used as an insulating film for a printed wiring board, no malfunction of a semiconductor is induced.

The following describes the (A) urethane imide oligomer having a terminal carboxylic acid group, the (B) thermosetting resin, other components, and a mixture method of (A) and (B), more specifically.

<(A) Urethane Imide Oligomer Having Terminal Carboxylic Acid Group>

A urethane imide oligomer having a terminal carboxylic acid group, used in the present invention, is an oligomer (i) which has at least one carboxylic acid provided at a terminal thereof, (ii) which has a urethane structure at an inner part thereof, (iii) whose imide ring is closed, and (iv) whose number-average molecular weight is not more than 30,000, more preferably not more than 20,000, based on polyethylene glycol.

More specifically, in the present invention, the (A) urethane imide oligomer having a terminal carboxylic acid group is a compound (i) which has no siloxane bond in its main chain skeleton, (ii) which has at least one repeating unit having a urethane bond, which repeating unit is represented by General Formula (5):

[Chem. 5]

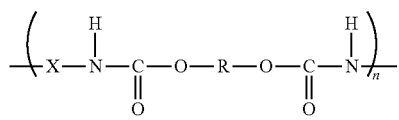

(5)

(wherein R and X independently represent a divalent organic group; and n represents an integer of not less than 1), and (iii) which has a structure having at least two imide bonds and at least one carboxyl group at its terminal, which structure is represented by General Formula (6):

[Chem. 6]

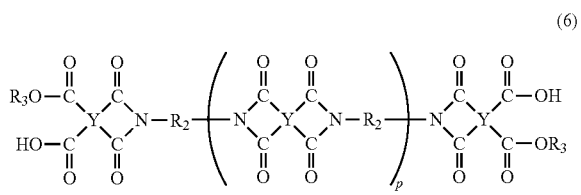

(6)

(wherein each $R_2$ independently represents a divalent organic group; each $R_3$ independently represents a hydrogen atom or an alkyl group; each Y independently represents a tetravalent organic group; and p represents an integer of not less than 0).

Further, the urethane imide oligomer, of the present invention, having a terminal carboxylic acid group has a number-average molecular weight of preferably not more than 30,000, more preferably not more than 20,000, particularly preferably not more than 15,000, based on polyethylene glycol. It is preferable to carry out a reaction by controlling the number-average molecular weight within the above range, because the urethane imide oligomer having a terminal carboxylic acid group is improved in solubility in organic solvent.

Further, the urethane imide oligomer, of the present invention, having a terminal carboxylic acid group has no siloxane bond in its structure. Accordingly, a cured film made from the urethane imide oligomer has a surface that is excellent in wettability, so that the cured film has excellent adhesiveness to various sealing agents. Moreover, since the bond in the structure is not an amide bond but an imide bond, the urethane imide oligomer having a terminal carboxylic acid group has excellent storage stability. Therefore, in a case where a resin composition solution is prepared with the use of the urethane imide oligomer, it is possible to restrain that the viscosity of the solution changes over time at the time of storage.

The (A) urethane imide oligomer having a terminal carboxylic acid group, which is used in the present invention, is not particularly limited provided that it has the aforementioned structure. However, the urethane imide oligomer having a terminal carboxylic acid group is prepared more preferably by (i) reacting at least a (a) diol compound represented by General Formula (1):

[Chem. 7]

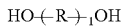

(1)

(wherein R represents a divalent organic group; and l represents an integer of 1 to 20), with a (b) diisocyanate compound represented by General Formula (2):

[Chem. 8]

$$O=C=N-X-N=C=O \quad (2)$$

(wherein X represents a divalent organic group), so as to synthesize a terminal isocyanate compound, (ii) reacting the terminal isocyanate compound with a (c) tetracarboxylic acid dianhydride represented by General Formula (3):

[Chem. 9]

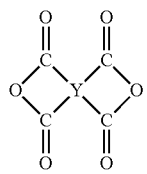

(3)

(wherein Y represents a tetravalent organic group), so as to synthesize a urethane imide oligomer having a terminal acid anhydride, and (iii) reacting the urethane imide oligomer having a terminal acid anhydride with (d) water and/or primary alcohol.

<(a) Diol Compound>

The (a) diol compound used in the present invention is a branched or straight-chain compound, as represented by General Formula (1), which has two hydroxyl groups in a molecule. The (a) diol compound is not particularly limited provided that it has the above structure. Examples of the diol compound encompass: alkylene diols such as ethyleneglycol, diethylene glycol, propylene glycol, 1,3-butanediol, 1,4-butanediol, 1,5-pentanediol, neopentyl glycol, 3-methyl-1,5-pentanediol, 1,6-hexanediol, 1,8-octanediol, 2-methyl-1,8-octanediol, 1,9-nonanediol, 1,10-decanediol, 1,4-cyclohexanediol, and 1,4-cyclohexanedimethanol; carboxyl group-containing diols such as dimethylolpropionic acid (2,2-bis(hydroxymethyl)propionic acid), dimethylol butanoic acid (2,2-bis(hydroxymethyl)butanoic acid), 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, and 3,5-dihydroxybenzoic acid; polyoxyalkylene diols such as polyethylene glycol, polypropylene glycol, polytetramethylene glycol, and a random copolymer of tetramethylene glycol and neopentyl glycol; a polyester diol obtained by reacting polyhydric alcohol and polybasic acid; a polycarbonate diol having a carbonate skeleton; a polycaprolactone diol obtained by carrying out ring opening addition of lactones such as γ-butyl lactone, ε-caprolactone, and δ-valerolactone; bisphenol A, an ethylene oxide adduct of bisphenol A, a propylene oxide adduct of bisphenol A, hydrogenated bisphenol A, an ethylene oxide adduct of hydrogenated bisphenol A, a propylene oxide adduct of hydrogenated bisphenol A, and the like. These compounds can be used solely, or two or more types thereof can be used in combination.

It is especially preferable to use, as the (a) diol compound, a polycarbonate diol represented by General Formula (4):

[Chem. 10]

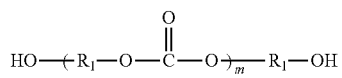

(4)

(wherein each $R_1$ independently represents a divalent organic group; and m represents an integer of 1 to 20). This is because an obtainable cured film can be further improved in heat resistance, flexibility, water resistance, chemical resistance, and electrical insulating reliability at a high temperature and a high humidity.

Specific examples of the polycarbonate diol encompass the following commercial products: trade names PCDL T-4671, T-4672, T-4691, T-4692, T-5650J, T-5651, T-5652, T-6001, and T-6002, each of which is manufactured by Asahi Kasei Chemicals Corporation; trade names PLACCEL CD CD205, CD205PL, CD205HL, CD210, CD210PL, CD210HL, CD220, CD220PL, and CD220HL, each of which is manufactured by Daicel Chemical Industries, Ltd.; trade names Kuraray Polyol C-1015N, C-1050, C-1065N, C-1090, C-2015N, C-2065N, and C-2090, each of which is manufactured by Kuraray Co., Ltd.; and trade names NIP-POLLAN 981, 980R, and 982R, each of which is manufactured by Nippon Polyurethane Industry Co., Ltd. These products can be used solely, or two or more types thereof can be used in combination. The polycarbonate diol has a number-average molecular weight of preferably 500 to 5,000, more preferably 750 to 2,500, particularly preferably 1,000 to 2,000, based on polystyrene. When the number-average molecular weight of the polycarbonate diol is within the range, an obtainable cured film can be improved in chemical resistance and flexibility. In a case where the number-average molecular weight is less than 500, the flexibility of an obtainable cured film may be decreased in some cases. Further, in a case where the number-average molecular weight is 5000 or more, the solvent solubility of the urethane imide oligomer having a terminal carboxylic acid group may be decreased in some cases.

Further, it is preferable that the polycarbonate diol and the carboxyl group-containing diol be used in combination. In this case, it is possible to introduce a carboxyl group into a side chain of an obtainable urethane imide oligomer having a terminal carboxylic acid group. This increases branch points in a main chain of the urethane imide oligomer having a terminal carboxylic acid group, thereby decreasing crystallinity. Hence, the solvent solubility of the urethane imide oligomer having a terminal carboxylic acid group can be improved.

<(b) Diisocyanate Compound>

The (b) diisocyanate compound used in the present invention is a compound having two isocyanate groups in a molecule, as represented by General Formula (2).

Examples of the (b) diisocyanate compound encompass, for example: aromatic diisocyanate compounds such as diphenylmethane-2,4'-diisocyanate, 3,2'- or 3,3'- or 4,2'- or 4,3'- or 5,2'- or 5,3'- or 6,2'- or 6,3'-dimethyl diphenylmethane-2,4'-diisocyanate, 3,2'- or 3,3'- or 4,2'- or 4,3'- or 5,2'- or 5,3'- or 6,2'- or 6,3'-diethyl diphenylmethane-2,4'-diisocyanate, 3,2'- or 3,3'- or 4,2'- or 4,3'- or 5,2'- or 5,3'- or 6,2'- or 6,3'-dimethoxy diphenylmethane-2,4'-diisocyanate, diphenylmethane-4,4'-diisocyanate, diphenylmethane-3,3'-diisocyanate, diphenylmethane-3,4'-diisocyanate, diphenylether-4,4'-diisocyanate, benzophenone-4,4'-diisocyanate, diphenylsulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate, and 4,4'-[2,2-bis(4-phenoxyphenyl)propane]diisocyanate; alicyclic diisocyanate compounds such as hydrogenated diphenylmethane diisocyanate, hydrogenated xylylene diisocyanate, isophorone diisocyanate, and norbornene diisocyanate; and aliphatic diisocyanate compounds such as hexamethylene diisocyanate, trimethyl hexamethylene diisocyanate, and lysine diisocyanate. These compounds can be used solely, or two or more types of them can be used in combination. The use of such a compound is preferable because a resultant cured film can be improved in heat resistance. Further, it is also possible to use a compound that is stabilized with a block agent necessary for avoiding a change over time. The block agent is not especially limited, and may be, for example, alcohol, phenol, oxime, or the like.

The (b) diisocyanate compound is particularly preferably diphenylmethane-4,4'-diisocyanate, diphenylmethane-3,3'-diisocyanate, diphenylmethane-3,4'-diisocyanate, tolylene-2,4-diisocyanate, tolylene-2,6-diisocyanate, or norbornene diisocyanate. These compounds are preferable because they can further improve a resultant cured film in heat resistance and water resistance.

<Synthesis Method of Terminal Isocyanate Compound>

A synthesis method used in the present invention for synthesizing a terminal isocyanate compound by reacting the (a) diol compound and the (b) diisocyanate compound is such that the diol compound and the diisocyanate compound are reacted with each other without solvent or in an organic solvent. In the reaction, the diol compound and the diisocyanate compound are mixed such that a ratio of the number of isocyanate groups to the number of hydroxyl groups (i.e., isocyanate group/hydroxyl group) is not less than 1 but not more than 2.10, more preferably not less than 1.10 but not more than 2.10, further preferably not less than 1.90 but not more than 2.10.

Further, in a case where two or more types of the (a) diol compound are used, the reaction thereof with the (b) diisocyanate compound may be carried out after the two or more types of the (a) diol compound are mixed, or each of the two or more types of the (a) diol compound may be reacted with the (b) diisocyanate compound, independently. Alternatively, the reaction may be carried out such that (i) a (a) diol compound is initially reacted with the (b) diisocyanate compound, (ii) a resultant terminal isocyanate compound is reacted with another (a) diol compound, and (iii) a reactant is further reacted with the (b) diisocyanate compound. Further, in a case where two or more types of the (b) diisocyanate compound are used, the reaction can be carried out in the same manner as above. In this way, an intended terminal isocyanate compound can be prepared.

The reaction between (a) and (b) is carried out at a temperature of, preferably, 40 to 160° C., more preferably 60 to 150° C. If the temperature is less than 40° C., it takes too much time for the reaction. If the temperature exceeds 160° C., a three-dimensional reaction occurs during the reaction, which easily causes gelatinization. How long the reaction is carried out can be determined appropriately depending on a batch scale and a reaction condition to be employed. Further, optionally, the reaction may be carried out in the presence of a catalyst such as tertiary amines or a metal or semi-metal compound (for example, alkaline metal, alkaline earth metal, tin, zinc, titanium, or cobalt).

The above reaction can be carried out without any solvent. However, in order to control the reaction, it is preferable to carry out the reaction by use of an organic solvent. Examples of the organic solvents encompass: sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; phenol-based solvents such as phenol, o-, m-, or p-cresol, xylenol, halogenated phenol, and catechol; hexamethylphosphoramide; γ-butyrolactone; and the like. Further, these organic solvents can be used optionally in combination with an aromatic hydrocarbon such as xylene or toluene, as needed.

Further examples of the organic solvent that can be used are solvents of symmetric glycol diethers such as methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxy)ethyl]ether), ethyl monoglyme (1,2-diethoxyethane), ethyl diglyme (bis(2-ethoxyethyl)ether), and butyl diglyme (bis(2-butoxyethyl)ether); solvents of acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether. Among these solvents, it is preferable to use the symmetric glycol dieters, because the symmetric glycol dieters hardly cause side reaction.

It is desirable that the solvent used in the reaction be added so that a solute weight concentration in a reaction solution, i.e., a concentration of the reaction solution is not less than 5% by weight but not more than 90% by weight. The solute weight concentration in the reaction solution is more desirably not less than 10% by weight but not more than 80% by weight. In a case where the concentration of the reaction solution is 5% by weight or less, it is difficult to cause a polymerization reaction and a reaction speed decreases. This may result in that an intended structural substance cannot be prepared. For this reason, the concentration of 5% by weight or less is not preferable.

Further, as for the terminal isocyanate compound obtained as a result of the reaction, an isocyanate group provided at a resin terminal can be blocked with a blocking agent such as alcohols, lactums, or oximes, after the synthesis is completed.

<Synthesis Method of Urethane Imide Oligomer Having Terminal Acid Anhydride>

The urethane imide oligomer having a terminal acid anhydride, used in the present invention, can be prepared by reacting the terminal isocyanate compound synthesized in the aforementioned manner, with a tetracarboxylic acid dianhydride. The terminal isocyanate compound and the tetracarboxylic acid dianhydride are mixed such that a ratio of the number of acid dianhydride groups to the number of isocyanate groups (i.e., acid dianhydride group/isocyanate group) is preferably not more than 2.10, more preferably not less than 1.10 but not more than 2.10, further preferably not less than 1.90 but not more than 2.10. The reaction between the terminal isocyanate compound and the tetracarboxylic acid dianhydride may be carried out with the use of the solvent that is used for synthesis of the terminal isocyanate compound. Optionally, a solvent as exemplified above may be further added.

<Tetracarboxylic Acid Dianhydride>

As the tetracarboxylic acid dianhydride for use in synthesizing the urethane imide oligomer having a terminal acid anhydride in the present invention, it is possible to use tetracarboxylic acid dianhydrides such as 3,3',4,4'-benzophenone tetracarboxylic acid dianhydride, pyromellitic acid dianhydride, 3,3',4,4'-oxydiphthalic acid dianhydride, 2,2-bis[4-(3,4-dicarboxyphenoxy)phenyl]propane dianhydride, 2,2-bis(4-hydroxyphenyl)propane dibenzoate-3,3',4,4'-tetracarboxylic acid dianhydride, 3,3',4,4'-diphenyl sulfone tetracarboxylic acid dianhydride, 3,3',4,4'-biphenyltetracarboxylic acid dianhydride, 2,3,3',4-biphenyltetracarboxylic acid dianhydride, and 5-(2,5-dioxotetrahydro-3-furanyl)-3-methyl-3-cyclohexene-1,2-dicarboxylic acid anhydride.

The tetracarboxylic acid dianhydride for use in synthesizing the urethane imide oligomer having a terminal acid anhydride is more preferably 2,2-bis[4-(3,4-dicarboxyphenoxy)phenyl]propane dianhydride, 3,3',4,4'-diphenyl sulfone tetracarboxylic acid dianhydride, 3,3',4,4'-oxydiphthalic acid dianhydride. With the use of such a tetracarboxylic acid dianhydride, it is possible to improve (i) an obtainable urethane imide oligomer having a terminal carboxylic acid group in terms of solubility in organic solvent and (ii) an obtainable cured film in terms of chemical resistance.

Further, the tetracarboxylic acid dianhydride is further preferably 2,2-bis[4-(3,4-dicarboxyphenoxy)phenyl]propane dianhydride or 5-(2,5-dioxotetrahydro-3-furanyl)-3-methyl-3-cyclohexene-1,2-dicarboxylic acid anhydride, from the viewpoint of compatibility to other materials contained in a thermosetting resin composition to be prepared.

The tetracarboxylic acid dianhydride used in the present invention is added preferably by not less than 1.50 mol but not more than 2.50 mol relative to 1 mol of polyol (more specifically, a diol compound) used for preparing the terminal isocyanate compound, from the viewpoint of preparing the urethane imide oligomer having a terminal carboxylic acid group so as to have a carboxyl group at each terminal thereof. The tetracarboxylic acid dianhydride is added particularly preferably by not less than 1.90 mol but not more than 2.10 mol. When the tetracarboxylic acid dianhydride is added in the above range, it is possible to reduce an amount of the tetracarboxylic acid dianhydride that does not contribute to the reaction.

<Method for Producing Urethane Imide Oligomer Having Terminal Acid Anhydride>

In producing the urethane imide oligomer having a terminal acid anhydride, various methods can be used as a method for reacting the terminal isocyanate compound and the tetracarboxylic acid dianhydride. The following describes typical methods, but any method can be used as long as a tetracarboxylic acid dianhydride can be provided at a terminal of the urethane imide oligomer.

Method 1: A tetracarboxylic acid dianhydride is dispersed or dissolved in an organic solvent, and then a terminal isocyanate compound is gradually added therein. A reaction temperature at this time is not less than 100° C. but not more than 300° C., more preferably not less than 140° C. but not more than 250° C. It is preferable that the reaction occur at the same time as addition of the terminal isocyanate compound during heating at such a temperature, so as to promote imidization. Such a method can be also employed that a terminal isocyanate compound and a tetracarboxylic acid dianhydride are completely dissolved at a low temperature, and a resultant mixture is heated to a high temperature so that the resultant mixture is imidized.

Method 2: A tetracarboxylic acid dianhydride is dispersed or dissolved in an organic solvent, and a terminal isocyanate compound is gradually added in a resultant mixture and dissolved therein. An obtained solution that is evenly dissolved is heated and dried in a vacuum pressure drier heated at not less than 100° C. but not more than 250° C., while air is evacuated, thereby carrying out imidization.

<Synthesis of Urethane Imide Oligomer Having Terminal Carboxylic Acid Group>

A urethane imide oligomer having a terminal carboxylic acid group is obtainable by reacting the urethane imide oligomer having a terminal acid anhydride thus prepared in the above method, with water and/or primary alcohol. The primary alcohol is not limited particularly. For example, methanol, ethanol, propanol, butanol, or the like can be used preferably.

The urethane imide oligomer having a terminal acid anhydride is reacted with water and/or primary alcohol in such a manner that the water and/or primary alcohol is added to the urethane imide oligomer having a terminal acid anhydride in a proportion of preferably not less than 2.0 times but not more than 300 times, further preferably not less than 2.0 time but not more than 200 times as large as a molar quantity of the tetracarboxylic acid dianhydride used for preparing the urethane imide oligomer having a terminal acid anhydride, so as to open a ring. The reaction can be carried out without any solvent. However, it is also possible to carry out the reaction with the use of the following solvents, for example: sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; phenol-based solvents such as phenol, o-, m-, or p-cresol, xylenol, halogenated phenol, and catechol; solvents of symmetric glycol diethers such as hexamethylphosphoramide, γ-butyrolactone, methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl) ether); solvents of acetates such as γ-butyrolactone, N-methyl-2-pyrrolidone, methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy)ethyl) acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether. Note that hexane, acetone, toluene, xylene or the like, each of which has a low boiling point, may be used in combination if necessary. Among these solvents, the solvents of the symmetric glycol dieters are particularly preferable because the oligomer is highly soluble therein.

The reaction is preferably carried out by heating in such a range that the water and/or primary alcohol thus added does not go beyond a reaction system. The heating is carried out at a temperature of not less than 20° C. but not more than 150° C., more preferably not more than 120° C. The temperature in the above range is preferable because the reaction is easily promoted. It is preferable to add a more amount of the water and/or primary alcohol. However, if the water and/or primary alcohol is added too much, solubility of other additive resins decreases. On this account, it is preferable to remove an unreacted residue after the reaction. The unreacted residue is removed at a temperature equal to or higher than a boiling point of the added water and/or primary alcohol. The heating at such a temperature can remove the unreacted residue out of the reaction system.

<(B) Thermosetting Resin>

The (B) thermosetting resin in the present invention is a compound that generates a crosslinked structure by heating, and serves as a crosslinking agent. Examples of the thermosetting resin encompass: thermosetting resins such as amino resin, melamine resin, guanamine resin, urea resin, sulfonamide resin, aniline resin, cyanate ester resin, isocyanate resin, epoxy resin, phenoxy resin, phenol resin, xylene resin, furan resin, oxetane resin, bismaleimide resin, bisallylnadiimide resin, benzoxazine, oxazoline resin, acrylic resin, methacrylic resin, curable hydrosilyl resin, curable allyl resin, alkyd resin, and unsaturated polyester resin; and side-chain reactive group type thermosetting polymers having a reactive group, such as an allyl group, a vinyl group, an alkoxysilyl group, a hydrosilyl group, an acryloyl group, or a methacryloyl group, on a side chain or a terminal of its polymer chain. Such thermosetting components, i.e., the (B) thermosetting resin can be used solely, or two or more types thereof can be used in combination.

Among these resins, it is more preferable to use the epoxy resin as the (B) thermosetting resin. If the thermosetting resin composition contains an epoxy resin component, not only heat resistance but also adhesiveness to a conductor (e.g., a metal foil) and a circuit board can be imparted to a cured resin obtained by curing the thermosetting resin composition.

The epoxy resin is a compound having at least two epoxy groups in a molecule. Examples of the epoxy resin encompass: bisphenol A type epoxy resins, such as trade names jER 828, jER 1001, and jER 1002, each manufactured by Japan Epoxy Resins Co., Ltd., trade names ADEKA RESIN EP-4100E and ADEKA RESIN EP-4300E manufactured by ADEKA Corporation, trade names RE-310S and RE-410S manufactured by Nippon Kayaku Co., Ltd., trade names EPICLON 840S, EPICLON 850S, EPICLON 1050, and EPICLON 7050, each manufactured by Dainippon Ink and Chemicals Inc., and trade names EPOTOHTO YD-115, EPOTOHTO YD-127, and EPOTOHTO YD-128, each manufactured by Tohto Kasei Co., Ltd.; bisphenol F type epoxy resins, such as trade names jER 806 and jER 807 manufactured by Japan Epoxy Resins Co., Ltd., ADEKA RESIN EP-4901E, ADEKA RESIN EP-4930, and ADEKA RESIN EP-4950, each manufactured by ADEKA Corporation, trade names RE-3035, RE-3045, RE-4035, and RE-4045, each manufactured by Nippon Kayaku Co., Ltd., trade names EPICLON 830 and EPICLON 835 manufactured by Dainippon Ink and Chemicals Inc., and trade names EPOTOHTO YDF-170, EPOTOHTO YDF-1755, and EPOTOHTO YDF-2001, each manufactured by Tohto Kasei Co., Ltd.; bisphenol S type epoxy resins, such as trade name EPICLON EXA-1514 manufactured by Dainippon Ink and Chemicals Inc.; hydrogenated bisphenol A type epoxy resins, such as trade names jERYX 8000, jERYX 8034, and jERYL 7170, each manufactured by Japan Epoxy Resins Co., Ltd., trade name ADEKA RESIN EP-4080E manufactured by ADEKA Corporation, trade name EPICLON EXA-7015 manufactured by Dainippon Ink and Chemicals Inc., and trade names EPOTOHTO YD-3000 and EPOTOHTO YD-4000D manufactured by Tohto Kasei Co., Ltd.; biphenyl type epoxy resins, such as trade names jERYX 4000, jERYL 6121H, jERYL 6640, and jERYL 6677, each manufactured by Japan Epoxy Resins Co., Ltd., and trade names NC-3000 and NC-3000H manufactured by Nippon Kayaku Co., Ltd.; phenoxy type epoxy resins, such as trade names jER 1256, jER 4250, and jER 4275, each manufactured by Japan Epoxy Resins Co., Ltd.; naphthalene type epoxy resins, such as trade names EPICLON HP-4032, EPICLON HP-4700, and EPICLON HP-4200, each manufactured by Dainippon Ink and Chemicals Inc., and trade name NC-7000L manufactured by Nippon Kayaku Co., Ltd.; phenol novolac type epoxy resins, such as trade names jER 152 and jER 154 manufactured by Japan Epoxy Resins Co., Ltd., trade name EPPN-201-L manufactured by Nippon Kayaku Co., Ltd., trade names EPICLON N-740 and EPICLON N-770 manufactured by Dainippon Ink and Chemicals Inc., and trade name EPOTOHTO YDPN-638 manufactured by Tohto Kasei Co., Ltd.; cresol novolac type epoxy resins, such as trade names EOCN-1020, EOCN-102S, EOCN-103S, and EOCN-104S, each manufactured by Nippon Kayaku Co., Ltd., and trade names EPICLON N-660, EPICLON N-670, EPICLON N-680, and EPICLON N-695, each manufactured by Dainippon Ink and Chemicals Inc.; trisphenolmethane type epoxy resins, such as trade names EPPN-501H, EPPN-501HY, and EPPN-502H, each manufactured by Nippon Kayaku Co., Ltd.; dicyclopentadiene type epoxy resins, such as trade name XD-1000 manufactured by Nippon Kayaku Co., Ltd. and trade name EPICLON HP-7200 manufactured by Dainippon Ink and Chemicals Inc.; amine type epoxy resins, such as trade names EPOTOHTO YH-434 and EPOTOHTO YH-434L manufactured by Tohto Kasei Co., Ltd.; flexible epoxy resins, such as trade names jER 871, jER 872, jERYL 7175, and jERYL 7217, each manufactured by Japan Epoxy Resins Co., Ltd., and trade name EPICLON EXA-4850 manufactured by Dainippon Ink and Chemicals Inc.; urethane-denatured epoxy resins, such as trade names ADEKA RESIN EPU-6, ADEKA RESIN EPU-73, and ADEKA RESIN EPU-78-11, each manufactured by ADEKA Corporation; rubber-denatured epoxy resins, such as trade names ADEKA RESIN EPR-4023, ADEKA RESIN EPR-4026, and ADEKA RESIN EPR-1309, each manufactured by ADEKA Corporation; and chelate-denatured epoxy resins, such as trade names ADEKA RESIN EP-49-10 and ADEKA RESIN E P-49-20 manufactured by ADEKA Corporation.

Further, in the thermosetting resin composition of the present invention, a curing agent for curing the thermosetting compound may be added. The curing agent is not particularly limited, but may be, for example: a phenolic resin such as phenol novolac resin, cresol novolac resin, or naphthalene type phenolic resin; melamine; dicyandiamide, or the like. Such a curing agent can be used solely, or two or more types of the curing agent can be used in combination.

Moreover, a curing accelerator for the thermosetting compound is not especially limited. Examples of the curing accelerator encompass: phosphine-based compounds such as triphenylphosphine; amine-based compounds such as tertiary amine, trimethanolamine, triethanolamine, and tetraethanolamine; borate-based compounds such as 1,8-diazabicyclo[5,4,0]-7-undecenium tetraphenylborate; imidazoles such as imidazole, 2-ethyl imidazole, 2-ethyl-4-methyl imidazole, 2-phenyl imidazole, 2-undecyl imidazole, 1-benzyl-2-methyl imidazole, 2-heptadecylimidazole, 2-isopropyl imidazole, 2,4-dimethyl imidazole, and 2-phenyl-4-methyl imidazole; imidazolines such as 2-methyl imidazoline, 2-ethyl imidazoline, 2-isopropyl imidazoline, 2-phenyl imidazoline, 2-undecylimidazoline, 2,4-dimethyl imidazoline, and 2-phenyl-4-methyl imidazoline; azine-based imidazoles such as 2,4-diamino-6-[2'-methylimidazolyl-(1')]-ethyl-s-triazine, 2,4-diamino-6-[2'-undecylimidazolyl-(1')]-ethyl-s-triazine, and 2,4-diamino-6-[2'-ethyl-4'-methylimidazolyl-(1')]-ethyl-s-triazine. These curing accelerators can be used solely, or two or more types thereof can be used in combination.

The component (B) is contained in the thermosetting resin composition of the present invention by preferably 1 to 100 parts by weight, more preferably 1 to 50 parts by weight, particularly preferably 5 to 50 parts by weight, relative to 100 parts by weight of the component (A).

By adjusting the amount of the component (B) in the above range, it is possible to improve a cured film obtainable by curing the thermosetting resin composition in heat resistance, chemical resistance, and electrical insulating reliability. Thus, the above range of the amount of the component (B) is preferable.

If the amount of the component (B) is less than the above range, a cured film obtainable by curing the thermosetting resin composition may have poor heat resistance and electrical insulating reliability. Further, if the amount of the component (B) is more than the above range, the cured film obtainable by curing the thermosetting resin composition is fragile and has poor flexibility, thereby causing the cured film to be warped largely.

(II) Photosensitive Resin Composition

A photosensitive resin composition of the present invention may contain at least the thermosetting resin composition, a (C) photosensitive resin, and a (D) photopolymerization initiator. As long as the thermosetting resin composition to be used for the photosensitive resin composition of the present invention is the aforementioned thermosetting resin composition, any thermosetting resin composition can be used without any particularly limitation.

That is, the photosensitive resin composition of the present invention may contain at least a (A) urethane imide oligomer having a terminal carboxylic acid group, a (B) thermosetting resin, a (C) photosensitive resin, and a (D) photopolymerization initiator.

Note that, in the photosensitive resin composition, as the (A) urethane imide oligomer having a terminal carboxylic acid group, it is more preferable to use a urethane imide oligomer having a terminal tetracarboxylic acid group which urethane imide oligomer is obtainable by use of a polycarbonate diol. However, the (A) urethane imide oligomer is not limited to this.

The inventors of the present invention found that a photosensitive resin composition of the present invention, which contains at least a (A) urethane imide oligomer having a terminal carboxylic acid group, a (B) thermosetting resin, a (C) photosensitive resin, and a (D) photopolymerization initiator, has various excellent properties. The inventors assume that the reasons thereof are as follows:

That is, the (A) urethane imide oligomer having a terminal carboxylic acid group has an imide skeleton and a urethane bond in a molecule. Therefore, the (A) urethane imide oligomer is excellent in (i) heat resistance and electrical insulating reliability, which are derived from the imide skeleton, and (ii) chemical resistance and flexibility, which are derived from the urethane bond. Moreover, since the (A) urethane imide oligomer has a carboxyl group at its terminal, the (A) urethane imide oligomer is soluble in a developing solution, as typified by a dilute alkaline aqueous solution. This allows an obtainable photosensitive resin composition to be finely processed by exposure and development. Especially, the urethane imide oligomer having a terminal tetracarboxylic acid group which urethane imide oligomer is obtained by use of a polycarbonate diol has excellent chemical resistance derived from its polycarbonate skeleton, thereby causing the following surprising effects. That is, even though the urethane imide oligomer has many carboxyl groups at its terminal, an exposed portion (cured portion) of an obtainable coating film is not damaged by a developing solution at all (that is, no swelling, dissolving, or the like of the coating film occurs). On the other hand, since the urethane imide oligomer has many carboxyl groups at its terminal as such, an unexposed portion (uncured portion) in the coating film is dissolved at short developing times. As a result, it is possible to obtain a pattern having very excellent resolution.

Since the components (A) and (B) have been already described in the foregoing (I), further explanations thereof are omitted. The following deals with the (C) photosensitive resin, the (D) photopolymerization initiator, other components, and how to mix the components (A) to (D).

<(C) Photosensitive Resin>

In the present invention, the (C) photosensitive resin is a resin in which a chemical bond is formed by a photopolymerization initiator. The photosensitive resin is preferably a resin having at least one unsaturated double bond in a molecule. Moreover, the unsaturated double bond is preferably an acrylic group ($CH_2=CH-$ group), a methacryloyl group ($CH=C(CH_3)-$ group), or a vinyl group ($-CH=CH-$ group).

Preferable examples of the (C) photosensitive resin encompass, for example: bisphenol F EO-denatured (n=2 to 50) diacrylate, bisphenol A EO-denatured (n=2 to 50) diacrylate, bisphenol S EO-denatured (n=2 to 50) diacrylate, bisphenol F EO-denatured (n=2 to 50) dimethacrylate, bisphenol A EO-denatured (n=2 to 50) dimethacrylate, bisphenol S EO-denatured (n=2 to 50) dimethacrylate, 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacyrlate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxy diethylene glycol methacrylate, methoxy polyethylene glycol methacrylate, β-methacryloyloxyethyl hydrogen phthalate, β-methacryloyloxyethyl hydrogen succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyloxyethyl hydrogen succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, 1,6-hexanediol dimethacrylate, neopentyl glycol dimethacrylate, polypropylene glycol dimethacrylate, 2-hydroxy-1,3-dimethacryloxypropane, 2,2-bis[4-(methacryloxyethoxy)phenyl]propane, 2,2-bis[4-(methacryloxy diethoxy)phenyl]propane, 2,2-bis[4-(methacryloxy polyethoxy)phenyl]propane, polyethylene glycol diacrylate, tripropylene glycol diacrylate, polypropylene glycol diacrylate, 2,2-bis[4-(acryloxy diethoxy)phenyl]propane, 2,2-bis[4-(acryloxy polyethoxy)phenyl]propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxypolyethylene glycol acrylate, nonylphenoxypolypropylene glycol acrylate, 1-acryloyloxypropyl-2-phthalate, isostearyl acrylate, polyoxyethylenealkyl ether acrylate, nonylphenoxyethylene glycol acrylate, polypropylene glycol dimethacrylate, 1,4- butanediol dimethacrylate, 3-methyl-1,5-pentanediol dimethacrylate, 1,6-mexanediol dimethacrylate, 1,9-nonanediol methacrylate, 2,4-diethyl-1,5-pentanediol dimethacrylate, 1,4-cyclohexane dimethanol dimethacrylate, dipropylene glycol diacrylate, tricyclodecane dimethanol diacrylate, 2,2-hydrogenated bis[4-(acryloxy polyethoxy)phenyl]propane, 2,2-bis[4-(acryloxy polypropoxy)phenyl]propane, 2,4-diethyl-1,5-pentanediol diacrylate, ethoxylated trimethylolpropane triacrylate, propoxylated trimethylolpropane triacrylate, isocyanuric acid tri(ethane acrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, triallyl isocyanurate, glycidyl methacrylate, glycidyl allyl ether, 1,3,5-triacryloylhexahydro-s-triazine, triallyl 1,3-5-benzenecarboxylate, triallylamine, triallyl citrate, triallyl phosphate, allobarbital, diallylamine, diallyl dimethyl silane, diallyl disulfide, diallyl ether, diallyl cyanurate, diallyl isophthalate, diallyl terephthalate, 1,3-diallyloxy-2-propanol, diallyl sulfide diallyl maleate, 4,4'-isopropylidene diphenol dimethacrylate, 4,4'-isopropylidene diphenol diacrylate, and the like. However, the (C) photosensitive resin preferably is not limited to the above examples. Especially, a diacrylate or methacrylate having 2 to 50 repeating units of EO (ethylene oxide) per molecule is preferable, and a diacrylate or methacrylate having 2 to 40 repeating units of EO per molecule is more preferable. When the diacrylate or methacrylate having 2 to 50 repeating units of EO is used, solubility of the photosensitive resin composition in an aqueous developing solution, which is typically represented by an alkaline aqueous solution, is improved, and the developing time is reduced. In addition to that, stress does not easily remain in a cured film prepared by curing the photosensitive resin composition. For example, when the photosensitive resin composition is laminated on a flexible printed wiring board (as one example of printed wiring boards) which includes a polyimide resin as a base material, curling of the printed wiring board can be restrained.

It is especially preferable to use the EO-denatured diacrylate or a dimethacrylate, and an acrylic resin having at least three acrylic groups or methacrylic groups in combination, in view of improving developing properties. Examples of the acrylic resin that is suitably used encompass ethoxylated isocyanuric acid EO-denatured triacrylate, ethoxylated isocyanuric acid EO-denatured trimethacrylate, ethoxylated trimethylolpropane triacrylate, ethoxylated trimethylolpropane triacrylate, ethoxylated trimethylolpropane triacrylate, trimethylolpropane triacrylate, propoxylated trimethylolpropane triacrylate, pentaerythritol triacrylate, ethoxylated pentaerythritol tetraacrylate, ethoxylated pentaerythritol tetraacrylate, ditrimethylolpropane tetraacrylate, ditrimethylolpropane tetraacrylate, propoxylated pentaerythritol tetraacrylate, pentaerythritol tetraacrylate, dipentaerythritol hexaacrylate, 2,2,2-trisacryloyloxymethylethyl succinic acid, 2,2,2-trisacryloyloxymethylethyl phthalic acid, propoxylated ditrimethylolpropane tetraacrylate, propoxylated dipentaerythritol hexaacrylate, ethoxylated isocyanuric acid triacrylate, ε-caprolactone denatured tris-(2-acryloxyethyl)isocyanurate, caprolactone denatured ditrimethylolpropane tetraacrylate, a compound represented by General Formula (7):

[Chem. 11]

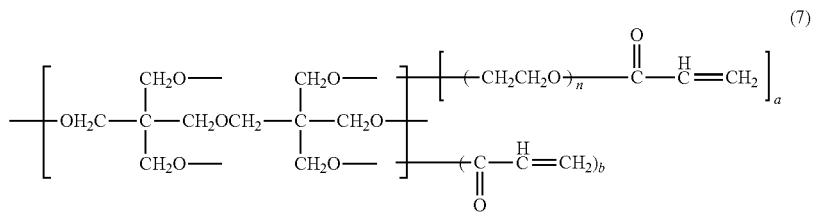

(wherein a+b=6, and n=12), a compound represented by General Formula (8):

[Chem. 12]

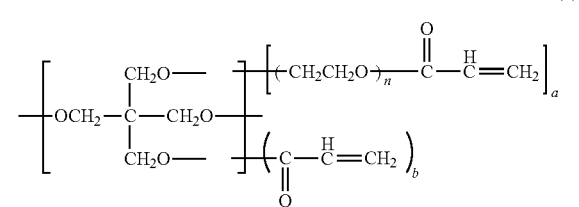

(wherein a+b=4, and n=4), a compound represented by General Formula (9):

[Chem. 13]

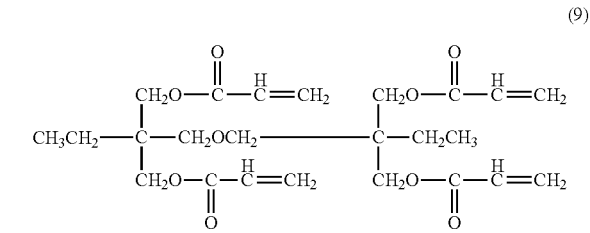

a compound represented by General Formula (10):

[Chem. 14]

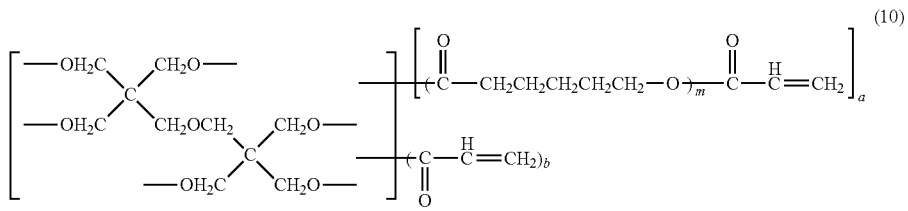

(wherein m=1, a=2, and b=4; or m=1, a=3, and b=3; or m=1, a=6, and b=0; or m=2, a=6, and b=0), a compound represented by General Formula (11):

[Chem. 15]

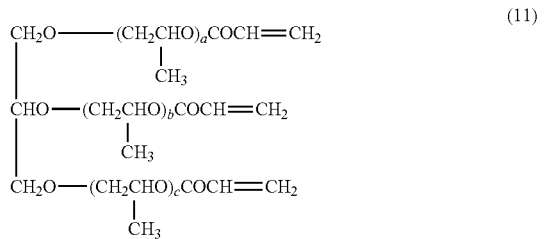

(wherein a+b+c=3.6), a compound represented by General Formula (12):

[Chem. 16]

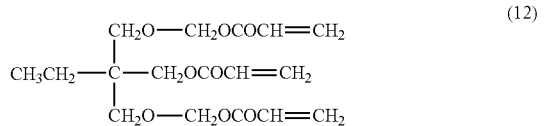

and a compound represented by General Formula (13):

[Chem. 17]

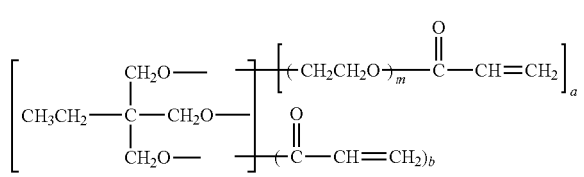

(wherein m·a=3 and a+b=3; "m·a" is a product of m and a).

Furthermore, compounds having a hydroxyl group and/or a carbonyl group in a molecular structural skeleton, such as 2-hydroxy-3-phenoxypropyl acrylate, phthalic acid monohydroxyethyl acrylate, ω-carboxy-polycaprolactone monoacrylate, acrylic acid dimer, pentaerythritol triacrylate, and pentaerythritol tetraacrylate are also preferably used.

Further, any other photosensitive resin, for example, epoxy-denatured acrylic (methacrylic) resins, urethane-denatured acrylic (methacrylic) resins, and polyester-denatured acrylic (methacrylic) resins, can be also used.

The photosensitive resin may be used solely. However, it is preferable to use two or more types of the photosensitive resins in combination, from the viewpoint of improving heat resistance of a cured film obtained after photo-curing.

<(D) Photopolymerization Initiator>

The (D) photopolymerization initiator in the present invention is a compound that is activated by energy of UV or the like, and initiates and promotes a reaction of a photosensitive resin. Examples of the (D) photopolymerization initiator encompass Michler's ketone, 4,4'-bis(diethylamino)benzophenone, 4,4',4"-tris(dimethylamino)triphenylmethane, 2,2'-bis(2-chlorophenyl)-4,4',5,5'-tetraphenyl-1,2'-diimidazole, acetophenone, benzoin, 2-methylbenzoin, benzoin methyl ether, benzoin ethyl ether, benzoin isopropyl ether, benzoin isobutyl ether, 2-t-butylanthraquinone, 1,2-benzo-9,10-anthraquinone, methylanthraquinone, thioxanthone, 2,4-diethylthioxanthone, 2-isopropylthioxanthone, 1-hydroxycyclohexyl phenyl ketone, diacetylbenzyl, benzyl dimethyl ketal, benzyl diethyl ketal, 2(2'-furilethylidene)-4,6-bis(trichloromethyl)-S-triazine, 2[2'(5"-methylfuril)ethylidene]-4,6-bis(trichloromethyl)-S-triazine, 2(p-methoxyphenyl)-4,6-bis(trichloromethyl)-S-triazine, 2,6-di(p-azidobenzal)-4-methylcyclohexanone, 4,4'-diazidochalcon, di(tetraalkylammonium)-4,4'-diazidostilbene-2,2'-disulfonate, 2,2-dimethoxy-1,2-diphenylethane-1-one, 1-hydroxy-cyclohexyl-phenyl-ketone, 2-hydroxy-2-methyl-1-phenyl-propane-1-one, 1-[4-(2-hydroxyethoxy)-phenyl]-2-hydroxy-2-methyl-1-propane-1-one, 2-methyl-1-[4-(methylthio)phenyl]-2-morpholinopropane-1-one, 2-benzyl-2-dimethylamino-1-(4-morpholinophenyl)-butane-1-one, bis(2,4,6-trimethylbenzoyl)-phenylphosphine oxide, bis(2,6-dimethoxybenzoyl)-2,4,4-trimethyl-pentylphosphine oxide, 2,4,6-trimethylbenzoyl-diphenyl-phosphine oxide, 2-hydroxy-2-methyl-1-phenyl-propane-1-ketone, bis(n5-2,4-cyclopentadiene-1-yl)-bis(2,6-difluoro-3-(1H-pyrrole-1-yl)-phenyl)titanium, 1,2-octanonedione, 1-[4-(phenylthio)-, 2-(O-benzoyloxime)], iodonium, (4-methylphenyl)[4-(2-methylpropyl)phenyl]-hexafluorophosphate(1-), ethyl-4-dimethylaminobenzoate, 2-ethylhexyl-4-dimethylaminobenzoate, ethanone, and 1-[9-ethyl-6-(2-methylbenzoyl)-9H-carbazol-3-yl]-1-(O-acetyloxime). The photopolymerization initiator is selected from among them, and further, it is preferable that one or more of the photopolymerization initiators be used in combination.

In the photosensitive resin composition of the present invention, it is preferable that the component (A), the component (B), the component (C), and the component (D) be mixed such that, relative to 100 parts by weight of a total solid content of the components (A) and (B), the component (C) is mixed by 10 to 200 parts by weight, and the component (D) is mixed by 0.1 to 50 parts by weight.

The above content ratio is preferable because a cured product and an insulting film that are ultimately obtained are improved in various properties (electrical insulating reliability and the like).

In a case where the amount of the (C) photosensitive resin is less than the above range, heat resistance of a cured coating film obtained by photo-curing the photosensitive resin composition is decreased and contrast of the cured coating film is not easily obtained when the cured coating film is exposed and developed. Therefore, such an amount of the (C) photosensitive resin is not preferable in some cases. When the (C) photosensitive resin is contained in the above range, it is possible to attain resolution of the cured coating film in an optimum range when the cured coating film is exposed and developed.

Further, in a case where the amount of the (D) photopolymerization initiator is less than the above range, it may become difficult to cause a curing reaction of an acrylic resin upon light irradiation, thereby often causing insufficient curing. In the meantime, if the (D) photopolymerization initiator is contained too much, it is difficult to adjust an irradiation amount of light, thereby causing overexposure in some cases. In view of this, in order to promote a photo-curing reaction effectively, it is preferable to adjust the amount of the (D) photopolymerization initiator in the above range.

<Other Components>

In order to improve adhesiveness and hardness of a cured film, an inorganic filler can be further used in the photosensitive resin composition of the present invention. The inorganic filler is not particularly limited, but may be, for example, barium sulfate, barium titanate, talc, ultrafine particulate anhydrous silica, synthetic silica, natural silica, calcium carbonate, magnesium carbonate, aluminum oxide, or the like. These can be used solely, or two or more thereof can be used in combination.

Further, the photosensitive resin composition of the present invention may include various additives, if necessary, such as a defoaming agent, a leveling agent, a flame retardant, a coloring agent, a tackifier, a polymerization inhibitor, and the like. These additives are not limited particularly. For example, the defoaming agent may be a silicon-based compound or an acryl-based compound, and the leveling agent may be a silicon-based compound or an acryl-based compound. Further, the flame retardant may be, for example, a phosphoric ester-based compound, a halogen-based compound, a metal hydroxide, an organophosphate-based compound, or the like. As the coloring agent, a phthalocyanine-based compound, an azo-based compound, carbon black, or oxidized titanium can be used. Further, the tackifier may be, for example, a silane coupling agent, a triazole-based compound, a tetrazole-based compound, a triazine-based compound, or the like. Moreover, as the polymerization inhibitor, hydroquinone, hydroquinone monomethylether or the like can be used. These additives can be used solely, or two or more types thereof can be used in combination.

<Method for Mixing (A) to (D)>

The photosensitive resin composition of the present invention can be prepared by uniformly mixing the aforementioned components (A) to (D), and any of the above other components if necessary. A method for uniformly mixing these components may be carried out by use of, for example, a general mixing device such as a three-roll or beads-mill device Further, in a case where an obtainable solution has a low viscosity, it is also possible to use a general stirring device to mix these components.

(III) Resin Composition Solution

A resin composition solution of the present invention prepared by dissolving, into an organic solvent, the thermosetting resin composition and the photosensitive resin composition is also included in the present invention. The thermosetting resin composition and the photosensitive resin composition are highly soluble in various organic solvents. Examples of the organic solvents encompass: sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; phenol-based solvents such as phenol, o-, m-, or p-cresol, xylenol, halogenated phenol, and catechol; solvents of symmetric glycol diethers such as hexamethylphosphoramide, γ-butyrolactone, methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); solvents of acetates such as γ-butyrolactone, N-methyl-2-pyrrolidone, methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether. Note that hexane, acetone, toluene, xylene or the like may be used in combination if necessary.

Among these solvents, the solvents of the symmetric glycol diethers are particularly preferable because the photosensitive resin composition is highly soluble therein.

In the resin composition of the present invention prepared by dissolving, into an organic solvent, the thermosetting resin composition and the photosensitive resin composition, it is preferable that the organic solvent be mixed therein by not less than 10 parts by weight but not more than 100 parts by weight, relative to 100 parts by weight of a total solid content of the components (A) and (B) or the components (A) to (D).

The resin composition solution prepared in the above range is preferable because a rate of reduction in film thickness after drying is small.

(IV) Use of Thermosetting Resin Composition

The thermosetting resin composition of the present invention can be formed into a cured film or patterned as follows directly or after the thermosetting resin composition solution is prepared. Initially, the thermosetting resin composition is applied to a substrate. Alternatively, the thermosetting resin composition solution is applied to a substrate, and is dried so as to remove an organic solvent. The application of the thermosetting resin composition or the thermosetting resin composition solution to the substrate may be carried out by screen printing, curtain rolling, reverse rolling, spray coating, rotational application by use of a spinner, or the like. An obtained applied film (having a thickness of preferably 5 to 100 μm, especially preferably 10 to 100 μm) is dried at not more than 120° C., preferably at 40 to 100° C. Subsequently, the applied film is subjected to a thermal curing treatment. Thus, a cured film having excellent heat resistance and flexibility can be prepared. In a case where the cured film is used as an insulating film for a printed wiring board, a thickness of the cured film is determined in consideration of a thickness of wiring lines and the like, but is preferably about 2 to 50 μm. As for a final curing temperature in the thermal curing treatment, it is desirable that the curing be carried out by heating at a low temperature so as to prevent oxidization of the wiring lines and the like and a decrease in adhesiveness of the wiring lines to a base material. In view of this, a thermal curing temperature is preferably not less than 100° C. but not more than 250° C., more preferably not less than 120° C. but not more than 200° C., particularly preferably not less than 130° C. but not more than 190° C. The higher a final heat temperature is, the more deterioration of the wiring lines due to oxidation may be promoted.

The cured film formed by use of the thermosetting resin composition of the present invention is excellent in heat resistance, chemical resistance, and electrical and mechanical properties, and especially in flexibility. For example, an insulating film of the present invention has a thickness of preferably about 2 to 50 μm. In view of this, the insulating film of the present invention is especially suitable as an insulating material for a high-density flexible substrate. Furthermore, the insulating film of the present invention is applicable to various types of heat-curable wiring coating protective agents, thermosetting heat-resistant adhesives, insulating coatings of an electric wire and cable, and the like.

In the present invention, it is also possible to provide a similar insulating material with the use of a thermosetting film obtainable by applying the thermosetting resin composition to a surface of a base material, and drying the thermosetting resin composition thus applied.

(V) Use of Photosensitive Resin Composition

The photosensitive resin composition of the present invention can be patterned as follows. Initially, the photosensitive resin composition is applied to a substrate and then dried so as to remove an organic solvent. The application of the photosensitive resin composition to the substrate may be carried out by screen printing, roller coating, curtain coating, spray coating, rotational application by use of a spinner, or the like. An obtained applied film (having a thickness of preferably 5 to 100 μm) is dried at not more than 120° C., preferably at 40 to 100° C. After the applied film is dried, a negative photomask is placed on the applied film thus dried, and the applied film is irradiated with active light such as ultraviolet rays, visible rays, electron beams, or the like. Then, a portion, in the applied film, that is not exposed to light is washed with a developing solution by a method such as a shower method, a paddle method, a soaking method, an ultrasonic method, or the like method so as to form a pattern. Since the time required for the pattern to be exposed differs depending on (i) spray pressure and flow speed of the developing device and (ii) a temperature of the developing solution, it is preferable to find an optimum condition for the device as appropriate.

As the developing solution, an alkaline aqueous solution is preferably used. The developing solution may contain a water-soluble organic solvent such as methanol, ethanol, n-propanol, isopropanol, or N-methyl-2-pyrrolidone. Examples of alkaline compounds used for preparing the alkaline aqueous solution encompass hydroxides, carbonates, hydrogencarbonates, or amine compounds of alkaline metals, alkaline earth metals, or ammonium ion, for example. More specifically, examples of the alkaline compounds encompass sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, triisopropylamine, and the like. Further, any other compounds are obviously usable as long as the aqueous solution exhibits basicity.

The alkaline compound preferably used in the step of developing the photosensitive resin composition of the present invention has a concentration of preferably 0.01 to 10% by weight, especially preferably 0.05 to 5% by weight. A temperature of the developing solution depends on a composition of the photosensitive resin composition and a composition of the developing solution. Generally, the temperature of the developing solution is preferably not less than 0° C. but not more than 80° C., more preferably not less than 20° C. but not more than 50° C.

The pattern thus formed in the developing step is rinsed to remove unnecessary residues of the developing solution. Examples of a rinsing fluid used for the rinse may be water and an acidic aqueous solution.

After that, a resultant film is subjected to a thermal-curing treatment. Thus, a cured film excellent in heat resistance and flexibility can be obtained. In a case where the cured film is used as an insulating film for a printed wiring board, a thickness of the cured film is determined in consideration of a thickness of wiring lines and the like, but is preferably about 2 to 50 μm. As for a final curing temperature in the thermal-curing treatment, it is desirable that the thermal curing be carried out at a low temperature so as to prevent oxidation of the wiring lines and the like and a decrease in adhesiveness of the wiring lines to a base material. The thermal-curing temperature at this time is preferably not less than 100° C. but not more than 250° C., further preferably not less than 120° C. but not more than 200° C., particularly preferably not less than 130° C. but not more than 190° C. If a final heat temperature is high, deterioration of the wiring lines due to oxidation may be promoted in some cases.

The pattern of the cured film formed by use of the photosensitive resin composition of the present invention is excellent in heat resistance, chemical resistance, and electrical and mechanical properties, and especially in flexibility. For example, an insulating film of the present invention has a thickness of preferably about 2 to 50 μm. The insulating film upon photo-curing has a resolution of at least up to 10 μm, and in particular, a resolution of about 10 to 1000 μm. In view of this, the insulating film of the present invention is especially suitable as an insulating material for a high-density flexible substrate. Furthermore, the insulating film of the present invention is applicable to various types of photo-curable wiring coating protective agents, photosensitive heat-resistant adhesives, insulating coatings of an electric wire and cable, and the like.

In the present invention, it is also possible to provide a similar insulating material with the use of a photosensitive film obtainable by applying the photosensitive resin composition to a surface of a base material, and drying the photosensitive resin composition thus applied.

EXAMPLES

The following describes Examples of the present invention, more specifically. However, the present invention is not limited to Examples as below.

Synthetic Example 1

Synthesis of Urethane Imide Oligomer Having Terminal Carboxylic Acid Group

Into a separable flask under nitrogen pressure, methyl triglyme (16.0 g) was poured as a solvent for polymerization. Then, 20.7 g (0.1004 mol) of norbornene diisocyanate was added thereto and heated to 80° C. so as to be dissolved in the methyl triglyme. Into a resultant solution, there was added, over 1 hour, a solution in which the following (a) and (b) components were dissolved into methyl triglyme (40.0 g): (a) 8.1 g (0.050 mol) of dimethylol butanoic acid (2,2-bis(hydroxymethyl) butanoic acid); and (b) 50.0 g (0.025 mol) of a polycarbonate diol (manufactured by Asahi Kasei Co., Ltd.: trade name PCDL T5652, a polycarbonate diol having an average molecular weight of 2,000 and represented by General Formula (14):

[Chem. 18]

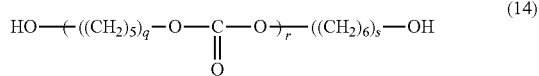

(14)

wherein q, r, and s are an integer of not less than 1).

A resultant solution was refluxed under heating for 5 hours. A reactant solution thus obtained is referred to as an intermediate A.

Into another reaction apparatus that was different from the reaction apparatus used for the above reaction, there were added 52.0 g (0.100 mol) of 2,2-bis[4-(3,4-dicarboxyphenoxy)phenyl]propane dianhydride (hereinafter referred to as BPADA) and methyl triglyme (40.0 g). This mixture was heated to 80° C. so that the BPADA was dispersed in the methyl triglyme.

Into a resultant solution, the intermediate A was added over 1 hour so that the intermediate A was reacted with the solution. After the addition of the intermediate A was completed, a resultant was heated to 200° C. so that the reaction was carried out for 3 hours. As a result of the reaction, a solution of a urethane imide oligomer having a terminal acid anhydride was prepared. Into this solution, 7.2 g (0.400 mol) of purified water was poured, and refluxed under heating at 80° C. for 5 hours. Thus, a solution of a urethane imide oligomer having a terminal carboxylic acid group was prepared. This synthetic resin is referred to as a resin A.

Example 1

Preparation of Thermosetting Resin Composition Solution

The obtained solution (resin A) of the urethane imide oligomer having a terminal carboxylic acid group was cooled down to a room temperature. Into the solution, there was added 10 parts by weight of an epoxy resin (manufactured by Dainippon Ink and Chemical: trade name EPICLON N-665-EXP, a cresol novolac type polyfunctional epoxy resin), relative to 100 parts by weight of a resin content in the solution. A resultant solution was uniformly stirred for 1 hour at the room temperature, so as to prepare a thermosetting resin composition solution. The solution thus prepared had a solute concentration of 60% and a viscosity of 230 poise at 23° C.

<Evaluation of Storage Stability of Thermosetting Resin Composition Solution>

In order to examine storage stability of the thermosetting resin composition solution, the thermosetting resin composition solution was hermetically sealed in a 10-ml screw tube, and left to stand for 1 month in a chamber maintained at 20° C. After 1 month, the viscosity of the solution was measured. The measured viscosity at that time was 230 poise at 23° C., and thus no change in viscosity was observed. It was accordingly demonstrated that the thermosetting resin composition solution was storable for a long period of time at the room temperature.

<Preparation of Cured Film on Polyimide Film>

With the use of a Baker's applicator, the thermosetting resin composition solution was flow-cast and applied to a polyimide film (manufactured by Kaneka Corporation: trade name 75NPI) having a thickness of 75 µm so that a finally dried film had a thickness of 25 µm. A resultant coating film was dried at 80° C. for 20 minutes, thereby preparing a resin film of the present invention on the polyimide film as a base. The resin film thus prepared was cured by heating at 160° C. for 90 minutes in the air so that the resin film was formed into a cured film. In this way, a polyimide film laminate in which the cured film was provided on the polyimide film as a base was prepared.

<Evaluation of Cured Film>

The cured film thus prepared was evaluated in terms of the following items. Evaluation results are shown in Table 1.

(i) Adhesiveness of Cured Film

Adhesive strength of the cured film thus prepared was evaluated by a cross-cut tape method in accordance with JIS K5400, as follows:

(I) A cured film in which no detachment was observed in the cross-cut tape method was evaluated as "G (Good)";

(II) A cured film in which half or more of grids remained was evaluated as "U (Unsatisfactory)"; and (III) A cured film in which less than half of grids remained was evaluated as "P (Poor)".

(ii) Stability of Cured Film in Environmental Resistance Test

If a cured film is not sufficiently cured by heating, stability of the cured film in an environmental test apparatus is decreased. In view of this, the stability, of the cured film thus prepared, in the environmental test apparatus was measured. With the use of a thermo-hygrostat Type: PR-1K, manufactured by ESPEC Corp., as the environmental test apparatus, evaluation was carried out such that a cured film provided on a polyimide film was subjected to an environment at 85° C./85% RH for 1000 hours, and then a condition of the cured film was observed. The evaluation was carried out as follows:

(I) A cured film having no change was evaluated as "G (Good)";

(II) A cured film that was partially dissolved was evaluated as "U (Unsatisfactory)"; and (III) A cured film that was completely dissolved was evaluated as "P (Poor)".

(iii) Chemical Resistance

Evaluation of chemical resistance was carried out on a surface of the cured film. The evaluation was carried out based on the following evaluation items 1 to 3 in such a manner that the polyimide film laminate was soaked and a surface of the cured film was observed.

Evaluation Item 1: A polyimide film laminate was soaked in methylethyl ketone at 25° C. for 10 minutes, and then dried by air.

Evaluation Item 2: A polyimide film laminate was soaked in a 2N hydrochloric acid solution at 25° C. for 10 minutes. The polyimide film laminate was then washed with purified water and dried by air.

Evaluation Item 3: A polyimide film laminate was soaked in a 2N sodium hydroxide solution at 25° C. for 10 minutes. The polyimide film laminate was washed with purified water and then dried by air.

The evaluation was carried out as follows:

(I) A cured film having no change was evaluated as "G (Good)";
(II) A cured film that was partially dissolved was evaluated as "U (Unsatisfactory)"; and
(III) A cured film that was completely dissolved was evaluated as "P (Poor)".

(vi) Flexibility Evaluation

The thermosetting resin composition solution was applied to a surface of a polyimide film (Apical 25NPI, manufactured by Kaneka Corporation) having a thickness of 25 μm so as to have a final film thickness of 25 μm. A resultant coating film was dried at 80° C. for 20 minutes, and then 160° C. for 90 minutes. Thus, a polyimide film laminate was prepared. The polyimide film laminate was cut out into strips of 30 mm×10 mm. Each of the strips was bent in the middle (at a point 15 mm from its edge) by 180° for 10 times. Then, a coating film (cured film) of each of the strips was observed with eyes to examine whether or not a crack occurred. The evaluation was carried out based on definition as follows:

(I) "G (Good)" indicates a cured film having no crack;
(II) "U (Unsatisfactory)" indicates a cured film having a slight crack; and
(III) "P (Poor)" indicates a cured film having a crack.

(v) Wettability

Wettability of the cured film prepared in the aforementioned <Preparation of Cured Film on Polyimide Film> was measured in accordance with a JIS K6768 measuring method.

TABLE 1

|  |  | Ex. 1 | Ex. 2 | Ex. 3 | Ex. 4 |
|---|---|---|---|---|---|
| Adhesiveness Of Coating Film | | G | G | G | G |
| Stability of Film in Environmental Resistance Test | | G | G | G | G |
| Chemical Resistance | Evaluation Item 1 | G | G | G | G |
|  | Evaluation Item 2 | G | G | G | G |
|  | Evaluation Item 3 | G | G | G | G |
| Flexibility Evaluation | | G | G | G | G |
| Wettability (mN/m) | | 38 | 38 | 38 | 36 |

Abbreviation:
Ex. stands for Example.
G stands for Good.

Synthesis Example 2

A resin was prepared in the same manner as Synthesis Example 1 except that, instead of adding 7.2 g (0.400 mol) of purified water, 12.8 g (0.400 mol) of methanol was added to a mixture obtained after a reaction was completed, so that the mixture was half-esterified. Thus, a solution of a urethane imide oligomer having a terminal carboxylic acid group was prepared. The resin thus synthesized in this manner is referred to as a resin B.

Example 2

Preparation of Thermosetting Resin Composition Solution

The prepared solution (resin B) of the urethane imide oligomer having a terminal carboxylic acid group was cooled down to a room temperature. Into the solution, there was added 10 parts by weight of an epoxy resin (manufactured by Dainippon Ink and Chemicals: trade name EPICLON N-665-EXP, a cresol novolac type polyfunctional epoxy resin), relative to 100 parts by weight of a resin content in the solution. A resultant solution was uniformly stirred for 1 hour at the room temperature, so as to prepare a thermosetting resin composition solution. The solution thus prepared had a solute concentration of 60% and a viscosity of 220 poise at 23° C.

<Evaluation of Storage Stability of Thermosetting Resin Composition Solution>

In order to examine storage stability of the thermosetting resin composition solution, the thermosetting resin composition solution was hermetically sealed in a 10-ml screw tube, and left to stand for 1 month in a chamber maintained at 20° C. After 1 month, the viscosity of the solution was measured. The measured viscosity at that time was 220 poise at 23° C., and thus no change in viscosity was observed. It was accordingly demonstrated that the thermosetting resin composition solution was storable for a long period of time at the room temperature.

Further, a cured film obtained from the thermosetting resin composition was evaluated in the same manner as the evaluation method of Example 1. Evaluation results are shown in Table 1.

Example 3

Preparation of Thermosetting Resin Composition Solution

Into the solution (resin A) of the urethane imide oligomer having a terminal carboxylic acid group, which was obtained in Example 1, there was added 10 parts by weight of an epoxy resin (manufactured by Nippon Kayaku Co., Ltd.: trade name NC-3000H, a biphenyl novolac type polyfunctional epoxy resin), relative to 100 parts by weight of a resin content in the solution. A resultant solution was uniformly stirred for 1 hour at the room temperature, so as to prepare a thermosetting resin composition solution. The solution thus prepared had a solute concentration of 60% and a viscosity of 250 poise at 23° C.

<Evaluation of Storage Stability of Thermosetting Resin Composition Solution>

In order to examine storage stability of the thermosetting resin composition solution, the thermosetting resin composition solution was hermetically sealed in a 10-ml screw tube, and left to stand for 1 month in a chamber maintained at 20° C. After 1 month, the viscosity of the solution was measured. The measured viscosity at that time was 250 poise at 23° C., and thus no change in viscosity was observed. It was accordingly demonstrated that the thermosetting resin composition solution was storable for a long period of time at the room temperature.

Further, a cured film obtained from the thermosetting resin composition was evaluated in the same manner as the evaluation method of Example 1. Evaluation results are shown in Table 1.

Example 4

Preparation of Thermosetting Resin Composition Solution

Into the solution (resin A) of the urethane imide oligomer having a terminal carboxylic acid group, which was obtained in Example 1, there was added 10 parts by weight of an oxetane resin (manufactured by Toagosei Co., Ltd.: trade name Aron Oxetane OXT-121, 1,4-bix{[(3-ethyl-3-oxetanyl)methoxy]methyl}benzene), relative to 100 parts by weight of a resin content in the solution. A resultant solution was uniformly stirred for 1 hour at the room temperature, so as to prepare a thermosetting resin composition solution. The solution thus prepared had a solute concentration of 60% and a viscosity of 180 poise at 23° C.

<Evaluation of Storage Stability of Thermosetting Resin Composition Solution>

In order to examine storage stability of the thermosetting resin composition solution, the thermosetting resin composition solution was hermetically sealed in a 10-ml screw tube, and left to stand for 1 month in a chamber maintained at 20° C. After 1 month, the viscosity of the solution was measured. The measured viscosity at that time was 180 poise at 23° C., and thus no change in viscosity was observed. It was accordingly demonstrated that the thermosetting resin composition solution was storable for a long period of time at the room temperature.

Further, a cured film obtained from the thermosetting resin composition was evaluated in the same manner as the evaluation method of Example 1. Evaluation results are shown in Table 1.

Comparative Synthesis Example 1

Into a 5-litter, 4-necked flask equipped with a stirrer, a condenser, a nitrogen-inlet tube, and a thermometer, there were added 227.5 g (0.909 mol) of diphenylmethane-2,4'-diisocyanate, 227.5 g (0.909 mol) of diphenylmethane-4,4'-diisocyanate, 644.9 g (1.8 mol) of 3,3',4,4'-diphenylsulfone tetracarboxylic acid dianhydride, and 1649.9 g of γ-butyrolactone. A resultant mixture was heated to 170° C. and reacted for 6 hours, thereby preparing a resin having a number-average molecular weight of 15,000. The resin thus synthesized is referred to as a resin C. The resin thus prepared was diluted with γ-butyrolactone. Then, 22.8 g of 2-butanone oxime was added thereto, and a resultant was heated at 90° C. for 3 hours, thereby preparing a polyamide imide resin solution having a nonvolatile content of 30% by weight.

Comparative Example 1

Preparation of Thermosetting Resin Composition Solution

Into the prepared polyamide imide resin solution, there was added 5 parts by weight of an epoxy resin (manufactured by Tohto Kasei Co., Ltd.: trade name YDF-170, a bisphenol F type epoxy resin), relative to 100 parts by weight of a resin content in the solution. A resultant solution was diluted with γ-butyrolactone, and uniformly stirred for 1 hour at a room temperature, thereby preparing a thermosetting resin composition solution. The solution had a solute concentration of 30% and a viscosity of 200 poise at 23° C.

<Evaluation of Storage Stability of Thermosetting Resin Composition Solution>

In order to examine storage stability of the thermosetting resin composition solution, the thermosetting resin composition solution was hermetically sealed in a 10-ml screw tube, and left to stand for 1 month in a chamber maintained at 20° C. After 1 month, the solution was gelatinized and the viscosity thereof was unmeasurable. Thus, it was demonstrated that this solution had poor storage stability at the room temperature.

Further, a cured film obtained from the thermosetting resin composition was evaluated in the same manner as the evaluation method of Example 1. Evaluation results are shown in Table 2.

Comparative Synthesis Example 2

Diphenylmethane-4,4'-diisocyanate (1.0 mol), diphenylmethane-2,4'-diisocyanate (1.0 mol), and poly(hexamethylene carbonate) (0.8 mol) having an average molecular weight of 2,000 were reacted with each other in 1-methyl-2-pyrrolidone under a nitrogen atmosphere at 100° C. for 1 hour. Then, 4,4'-oxydiphthalic acid anhydride (1.0 mol), triethylamine, and 1-methyl-2-pyrrolidone were added thereto, and a resultant mixture was further stirred at 100° C. for 3 hours. Further, benzyl alcohol was added to the mixture and stirred at 100° C. for 1 hour, and a reaction was completed. A resultant solution was poured into water that was stirred intensely so as to filter the resultant solution to separate a precipitate. The precipitate was then dried in vacuum at 80° C. for 8 hours, so as to obtain a polyurethane imide resin. The resin thus synthesized is referred to as a resin D. The polyurethane imide resin thus obtained was measured by use of GPC. As a result of the measurement, the polyurethane imide resin was such that Mw=55,000 and Mn=25,000, based on polystyrene.

Comparative Example 2

Preparation of Thermosetting Resin Composition Solution

The prepared polyurethane imide resin was dissolved in methylethyl ketone so as to have a solute concentration of 40% by weight, thereby preparing a polyurethane imide resin solution. Then, into the polyurethane imide resin solution, there were added 25 parts by weight of a urethane acrylate resin (manufactured by Shin-Nakamura Chemical Co., Ltd.: trade name U-108) and, as a curing agent, 3.75 parts by weight of 1,1-bis(t-hexyl peroxy)-3,3,5-trimethyl cyclohexane (manufactured by Nippon Yushi K.K.: trade name Perhexa TMH), relative to 100 parts by weight of a resin content in the solution. A resultant mixture was uniformly stirred for 1 hour at a room temperature, thereby preparing a thermosetting resin composition solution. The solution thus prepared had a solute concentration of 40% and a viscosity of 1200 poise at 23° C. As such, the solution was very viscous.

<Evaluation of Storage Stability of Thermosetting Resin Composition Solution>

In order to examine storage stability of the thermosetting resin composition solution, the thermosetting resin composition solution was hermetically sealed in a 10-ml screw tube, and left to stand for 1 month in a chamber maintained at 20° C. After 1 month, the solution was gelatinized and the viscosity thereof was unmeasurable. Thus, it was demonstrated that this solution had poor storage stability at the room temperature.

Further, a cured film obtained from the thermosetting resin composition was evaluated in the same manner as the evaluation method of Example 1. Evaluation results are shown in Table 2.

Comparative Synthesis Example 3

Into a flask equipped with a stirrer, a thermometer, and a condenser, there were added 1496 parts of EDGA (diethylene glycol monomethylether acetate), 888 parts (4 mol) of IPDI (isophorone diisocyanate), and 960 parts (5 mol) of trimellitic anhydride, and a temperature of the flask was increased to 160° C. A reaction of these substances was promoted while foaming. The reaction was carried out for 4 hours while the temperature was maintained at 160° C. In the reaction system, a clear liquid in light brown color was obtained. The clear liquid thus obtained was subjected to a characteristic absorption measurement by use of infrared spectrum. As a result of the measurement, characteristic absorption of an isocyanate group at 2270 cm$^{-1}$ was completely disappeared, and absorption of an imide group at 725 cm$^{-1}$, 1780 cm$^{-1}$, and 1720 cm$^{-1}$ was observed. The resin thus synthesized is referred to as a resin E. The resin E had an acid number of 85 KOHmg/g based on a solid content. As for a molecular weight of the resin E, the resin E had a number-average molecular weight of 1,600 based on polystyrene.

Comparative Example 3

Preparation of Thermosetting Resin Composition Solution

Into a terminal carboxylic acid imide oligomer solution thus prepared, there was added 38.50 g of an epoxy resin (manufactured by Dainippon Ink and Chemicals: trade name EPICLON N-665-EXP, a cresol novolac type polyfunctional epoxy resin), relative to 100 parts by weight of a resin content in the solution. A resultant solution was uniformly stirred for 1 hour at a room temperature, thereby preparing a thermosetting resin composition solution. The solution thus prepared had a solute concentration of 68% and a viscosity of 250 poise at 23° C.

<Evaluation of Storage Stability of Thermosetting Resin Composition Solution>

In order to examine storage stability of the thermosetting resin composition solution, the thermosetting resin composition solution was hermetically sealed in a 10-ml screw tube, and left to stand for 1 month in a chamber maintained at 20° C. After 1 month, the solution was gelatinized and the viscosity thereof was unmeasurable. Thus, it was demonstrated that this solution had poor storage stability at the room temperature.

Further, a cured film obtained from the thermosetting resin composition was evaluated in the same manner as the evaluation method of Example 1. Evaluation results are shown in Table 2.

Comparative Synthesis Example 4

Initially, air in a 4-necked flask was replaced with nitrogen, and a stirrer, a nitrogen-inlet tube, a reflux condenser, and a stopper were attached to the flask. Then, into the flask, 20.23 g (68.76 mmol) of 2,3,3',4'-biphenyltetracarboxylic acid dianhydride and 30 g of methanol were added and refluxed. After 3 hours, a temperature in the flask was cooled down to a room temperature, and the reflux condenser was replaced with a reflux condenser equipped with a mist separator. Subsequently, 0.07 g of a defoaming agent (made by Dow Corning Asia Ltd.: trade name FS Antifoam DB-100) and 31.01 g (34.38 mmol) of amino-denatured silicone oil (made by Dow Corning Toray Silicone Company Ltd.: trade name BY16-853U, amine number of 451) were added to the flask, and methanol was distilled away over 1 hour. After that, the temperature in the flask was increased to 190° C., and a reaction was carried out for 1 hour while water was distilled away, so as to prepare 48.75 g (yield: 97.50%) of a viscous product in brownish-red color. The resin thus synthesized is referred to as a resin F. The resin had a viscous of 392 poise at 80° C.

Comparative Example 4

Preparation of Thermosetting Resin Composition Solution

A siloxane imide resin having a terminal acid anhydride, prepared in the above manner, was dissolved in methylethyl ketone so as to have a solute concentration of 40% by weight, thereby preparing a solution of the siloxane imide resin having a terminal acid anhydride. Then, into the solution, there were added 100 parts by weight of an epoxy resin (made by Japan Epoxy Resins Co., Ltd.: trade name jER 828, a bisphenol A type bifunctional epoxy resin), 116 parts by weight of a curing agent of a cycloaliphatic acid anhydride type (Japan Epoxy Resins Co., Ltd.: trade name Epicure YH306), and 1 part by weight of an accelerator catalyst (made by Shikoku Chemical Corporation: trade name Curezole 2E4MZ, an imidazole compound), relative to 24 parts by weight of a resin content in the solution. A resultant mixture was uniformly stirred for 1 hour at a room temperature, so as to prepare a thermosetting resin composition solution. The solution had a solute concentration of 87% and a viscosity of 320 poise at 23° C.

<Evaluation of Storage Stability of Thermosetting Resin Composition Solution>

In order to examine storage stability of the thermosetting resin composition solution, the thermosetting resin composition solution was hermetically sealed in a 10-ml screw tube, and left to stand for 1 month in a chamber maintained at 20° C. After 1 month, the solution was gelatinized and the viscosity thereof was unmeasurable. Thus, it was demonstrated that this solution had poor storage stability at the room temperature.

Further, a cured film obtained from the thermosetting resin composition was evaluated in the same manner as the evaluation method of Example 1. Evaluation results are shown in Table 2.

TABLE 2

| | Com. Ex. 1 | Com. Ex. 2 | Com. Ex. 3 | Com. Ex. 4 |
|---|---|---|---|---|
| Adhesiveness Of Coating Film | G | G | G | U |
| Stability of Film in Environmental Resistance Test | P | P | G | G |
| Chemical Evaluation Resistance Item 1 | U | U | G | G |

TABLE 2-continued

|  | Com. Ex. 1 | Com. Ex. 2 | Com. Ex. 3 | Com. Ex. 4 |
|---|---|---|---|---|
| Evaluation Item 2 | G | G | G | G |
| Evaluation Item 3 | G | G | G | G |
| Flexibility Evaluation | G | G | P | P |
| Wettability (mN/m) | 38 | 36 | 38 | 30 or less |

Abbreviation:
Com. Ex. stands for Comparative Example;
G stands for Good;
U stands for Unsatisfactory; and
P stands for Poor.

Comparative Synthesis Example 5

Synthesis of Urethane Imide Oligomer Having Terminal Acid Anhydride

Into a separable flask under nitrogen pressure, methyl triglyme (16.0 g) was added as a solvent for polymerization. Then, 20.7 g (0.1004 mol) of norbornene diisocyanate was added thereto and heated to 80° C. so as to be dissolved in the methyl triglyme. Into a resultant solution, there was added, over 1 hour, a solution in which the following (a) and (b) components were dissolved into methyl triglyme (40.0 g): (a) 8.1 g (0.050 mol) of dimethylol butanoic acid (2,2-bis(hydroxymethyl)butanoic acid); and (b) 50.0 g (0.025 mol) of polycarbonate diol (manufactured by Asahi Kasei Co., Ltd.: trade name PCDL T5652, a polycarbonate diol having an average molecular weight of 2,000 and represented by General Formula (14):

[Chem. 19]

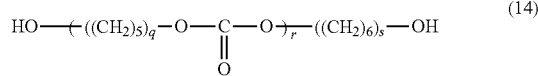

(14)

wherein q, r, and s are an integer of not less than 1).
A resultant solution was refluxed under heating for 5 hours. A reactant solution thus obtained is referred to as an intermediate A.
Into another reaction apparatus that was different from the reaction apparatus used for the above reaction, there were added 52.0 g (0.100 mol) of 2,2-bis[4-(3,4-dicarboxyphenoxy)phenyl]propane dianhydride (hereinafter referred to as BPADA) and methyl triglyme (40.0 g). This mixture was heated to 80° C. so that the BPADA was dispersed in the methyl triglyme.
Into a resultant mixture, the intermediate A was added over 1 hour so that the intermediate A was reacted with the mixture. After the addition of the intermediate A was completed, a resultant was heated to 200° C. so that the reaction was carried out for 3 hours. As a result of the reaction, a solution of a urethane imide oligomer having a terminal acid anhydride was prepared.

Comparative Example 5

Preparation of Thermosetting Resin Composition Solution

The solution of the urethane imide oligomer having a terminal acid anhydride was cooled down to a room temperature. Into the solution, there was added 10 parts by weight of an epoxy resin (manufactured by Dainippon Ink and Chemical: trade name EPICLON N-665-EXP, a cresol novolac type polyfunctional epoxy resin) relative to 100 parts by weight of a resin content in the solution. A resultant solution was uniformly stirred for 1 hour at the room temperature, so as to prepare a thermosetting resin composition solution. The solution thus prepared had a solute concentration of 60% and a viscosity of 240 poise at 23° C.

<Evaluation of Storage Stability of Thermosetting Resin Composition Solution>

In order to examine storage stability of the thermosetting resin composition solution, the thermosetting resin composition solution was hermetically sealed in a 10-ml screw tube, and left to stand for 1 month in a chamber maintained at 20° C. After 1 month, the solution was gelatinized and the viscosity thereof was unmeasurable. Thus, it was demonstrated that this solution had poor storage stability at the room temperature.

Further, evaluation on a cured film obtained from the thermosetting resin composition was attempted in the same manner as the evaluation method of Example 1. However, due to the gelatinization of the thermosetting resin composition solution, it was difficult to apply the solution onto a base material. Consequently, a uniform cured film could not be obtained.

Examples 5 to 8

Preparation of Photosensitive Resin Composition

A (A) urethane imide oligomer having a terminal carboxylic acid group, which was obtained in Synthesis Example 1 or 2, a (B) thermosetting resin, a (C) photosensitive resin, a (D) photopolymerization initiator, and other components were mixed to prepare a photosensitive resin composition. Respective amounts of constituent raw materials in terms of a resin solid content, and types of the constituent raw materials are shown in Table 3. In Table 3, the amount of 1,2-bis(2-methoxyethoxy)ethane as a solvent indicates a total amount of solvent including a solvent contained in the synthetic resin solution and the like. The mixed solution was set in a defoaming device so that the solution was completely defoamed. A resultant solution was then evaluated as follows.

TABLE 3

| Component | | Unit: Part by Weight | | | |
|---|---|---|---|---|---|
|  |  | Ex. 5 | Ex. 6 | Ex. 7 | Ex. 8 |
| (A) | Resin A | 60.0 | — | 60.0 | 60.0 |
|  | Resin B | — | 60.0 | — | — |
| (B) | N-665-EXP <1> | 10.0 | 10.0 | — | — |
|  | NC-3000H <2> | — | — | 10.0 | — |
|  | OXT-121 <3> | — | — | — | 10.0 |
| (C) | A-9300 <4> | 3.0 | 3.0 | 3.0 | 3.0 |
|  | BPE-1300 <5> | 12.0 | 12.0 | 12.0 | 12.0 |
| (D) | IRGACURE 819 <6> | 2.0 | 2.0 | 2.0 | 2.0 |
| Others | Barium Sulfate | 12.0 | 12.0 | 12.0 | 12.0 |
|  | Aerosil R-974 <7> | 1.0 | 1.0 | 1.0 | 1.0 |
|  | 1,2-bis(2-methoxyethoxy)ethane | 50 | 50 | 50 | 50 |

TABLE 3-continued

| Component | | Unit: Part by Weight | | | |
|---|---|---|---|---|---|
| | | Ex. 5 | Ex. 6 | Ex. 7 | Ex. 8 |
| | Solid Content Concentration of Photosensitive Resin Composition Solution | 66.6 | 66.6 | 66.6 | 66.6 |

<1> Cresol novolac type polyfunctional epoxy resin, trade name: EPICLON N-665-EXP, manufactured by Dainippon Ink and Chemicals
<2> Biphenyl novolac type polyfunctional epoxy resin, trade name: NC-3000H, manufactured by Nippon Kayaku Co., Ltd.
<3> Oxetane resin, trade name: Aron Oxetane OXT-121, manufactured by Toagosei Co., Ltd.
<4> Ethoxylated isocyanuric acid triacrylate, trade name: NK ester A-9300, manufactured by Shin-Nakamura Chemical Co., Ltd.
<5> Bisphenol A EO-denatured diacrylate, trade name: NK ester BPE-1300, manufactured by Shin-Nakamura Chemical Co., Ltd.
<6> Product manufactured by CIBA specialty chemicals Inc.: Photopolymerization initiator
<7> Product manufactured by Nippon AEROSIL Co., Ltd.: Silica particles <Preparation of Coating Film on Polyimide Film>

With the use of a Baker's applicator, each of the photosensitive resin composition solutions thus prepared was flow-cast and applied to a polyimide film (manufactured by Kaneka Corporation: trade name 75NPI) having a thickness of 75 μm in an area of 100 mm×100 mm so as to have a final dried film thickness of 25 μm, and dried 80° C. for 20 minutes. A negative photomask having an area of 50 mm×50 mm with line width/space width=100 μm/100 μm was placed thereon. Resultant films were then exposed to ultraviolet rays having an integrated exposure amount of 300 mJ/cm$^2$. Then, the films were developed by spraying a 1.0 weight % sodium carbonate aqueous solution heated at 30° C., at a spraying pressure of 1.0 kgf/mm$^2$ for 60 seconds. After the development, the films were washed with purified water sufficiently, and then cured by heating in an oven at 160° C. for 90 minutes. Thus, cured films of the respective photosensitive resin compositions were prepared.

<Evaluation of Cured Film>

The cured films thus prepared were evaluated in regard to the following items. Evaluation results are shown in Table 4.

(i) Photosensitivity Evaluation

Photosensitivity of each of the photosensitive resin compositions was evaluated by observing a surface of a corresponding cured film prepared in the aforementioned item <Preparation of Coating Film on Polyimide Film>. The evaluation was based on definition as follows:
(I) "G (Good)" indicates a polyimide film in which a sensitive pattern of line width/space width=100/100 μm was clearly formed on a surface thereof, no deformation of lines caused by detachment of line portions occurred, and dissolution residues were not observed on space portions;
(II) "U (Unsatisfactory)" indicates a polyimide film in which a sensitive pattern of line width/space width=100/100 μm was clearly formed on a surface thereof, deformation of lines caused by detachment of line portions occurred, but dissolution residues were not observed on space portions; and
(III) "P (Poor)" indicates a polyimide film in which a sensitive pattern of line width/space width=100/100 μm was not clearly formed on a surface thereof, line portions were detached, and dissolution residues were observed on space portions.

(ii) Adhesiveness of Cured Film

Adhesive strength of each of the cured films prepared in the aforementioned item <Preparation of Coating Film on Polyimide Film> was evaluated by a cross-cut tape method in accordance with JIS K5400 as follows:
(I) "G (Good)" indicates a cured film in which no detachment was observed in the cross-cut tape method;
(II) "U (Unsatisfactory)" indicates a cured film in which 95% or more of grids remained; and
(III) "P (Poor)" indicates a cured film in which the amount of remaining grids was less than 80%.

(iii) Solvent Resistance

Solvent resistance of each of the cured films prepared in the aforementioned item <Preparation of Coating Film on Polyimide Film> was evaluated. The evaluation was carried out in such a manner that after a cured film was immersed in methylethyl ketone at 25° C. for 15 minutes, the cured film was dried by air, and a surface of the cured film thus dried was observed. The evaluation was based on definition as follows:
(I) "G (Good)" indicates a coating film (cured film) having no problem; and
(II) "P (Poor)" indicates a coating film (cured film) having a problem such as swelling or detachment.

(iv) Flexibility

In the same manner as in the item <Preparation of Coating Film on Polyimide Film>, each of the photosensitive resin compositions was applied on a surface of a polyimide film (Apical 25 NPI manufactured by Kaneka Corporation) having a thickness of 25 μm, so as to prepare a cured-film-laminated film. The cured-film-laminated film was then cut out into strips of 30 mm×10 mm. Each of the strips was bent in the middle (at a point 15 mm from its edge) by 180° for 10 times. Then, a coating film (cured film) of each of the strips was observed with eyes to examine whether or not a crack occurred. The evaluation was carried out based on definition as follows:
(I) "G (Good)" indicates a cured film having no crack;
(II) "U (Unsatisfactory)" indicates a cured film having a slight crack; and
(III) "P (Poor)" indicates a cured film having a crack.

(v) Insulation Reliability

On a flexible copper-clad laminate (the thickness of a copper foil is 12 μm, a polyimide film is Apical 25 NPI manufactured by Kaneka Corporation, and the copper foil is bonded by a polyimide adhesive agent), a comb-shaped pattern (line width/space width=100 μm/100 μm) was formed. The flexible copper-clad laminate was then immersed in a 10 volume % sulfuric acid aqueous solution for 1 minute, washed with purified water, and subjected to a surface treatment of the copper foil. After that, in the same manner as in <Preparation of Coating Film on Polyimide Film>, a cured film of a photosensitive resin composition was formed on the comb-shaped pattern, so as to prepare a test piece. The test piece was set in an environmental test apparatus at 85° C. and 85% RH, and a direct current at 100 V was applied to both ends of the test piece, so as to observe a change in insulation resistance values, an occurrence of migration, and the like. The evaluation was carried out based on definition as follows:
(I) "G (Good)" indicates one in which 1000 hours after the start of the test, a resistance value was not less than $10^8$, and no occurrence of migration, formation of dendrites, or the like was observed;
(II) "P (Poor)" indicates one in which 1000 hours after the start of the test, an occurrence of migration, formation of dendrites, or the like was observed.

(vi) Wettability

Wettability of each of the cured films prepared in the aforementioned item <Preparation of Coating Film on Polyimide Film> was measured in accordance with JIS K6768.

(vii) Solder Heat Resistance

In the same manner as in the aforementioned item <Preparation of Coating Film on Polyimide Film>, a cured-filmlaminated film was prepared by applying the photosensitive resin composition on a surface of a polyimide film (manufactured by Kaneka Corporation, APICAL 75NPI) having a thickness of 75 μm.

A resultant coated film was floated on a solder bath that was completely melted at 260° C., so that a surface of the resultant coated film on which surface a cured film of the photosensitive resin composition was formed made contact with the solder bath. Ten seconds later, the coated film was pulled up. This operation was repeated 3 times, and the adhesive strength of the cured film was evaluated by a cross-cut tape method in accordance with JIS K5400 as follows:

(I) "G (Good)" indicates a cured film in which no detachment was observed in the cross-cut tape method;
(II) "U (Unsatisfactory)" indicates a cured film in which 95% or more of grids remained; and
(III) "P (Poor)" indicates a cured film in which the amount of remaining grids was less than 80%.

(viii) Warpage

In the same manner as in the aforementioned item <Preparation of Coating Film on Polyimide Film>, a cured-film-laminated film was prepared by applying the photosensitive resin composition on a surface of a polyimide film (manufactured by Kaneka Corporation, APICAL 25NPI) having a thickness of 25 μm.

The cured film was cut out into a film having an area of 50 mm×50 mm, and the film was placed on a flat and smooth table so that a coating film (cured film) thereof turned up. Then, how much an end portion of the film was warped was measured. FIG. 1 is a schematic view illustrating which portion in the film is to be measured. As the amount of warpage on a surface of the polyimide film is less, stress exerted on a surface on a printed wiring board becomes small. This results in that the amount of warpage of the printed wiring board is also decreased. In view of this, it is preferable that the amount of warpage be not more than 5 mm.

TABLE 4

| Evaluation Item | Ex. 5 | Ex. 6 | Ex. 7 | Ex. 8 | Com. Ex. 6 | Com. Ex. 7 | Com. Ex. 8 | Com. Ex. 9 |
|---|---|---|---|---|---|---|---|---|
| Photo-sensitivity | G | G | G | G | P | P | G | G |
| Adhesiveness | G | G | G | G | G | G | G | G |
| Solvent Resistance | G | G | G | G | G | G | G | U |
| Flexibility | G | G | G | G | G | G | P | G |
| Insulation Reliability | G | G | G | G | G | G | G | P |
| Wettability (mN/m) | 38 | 38 | 38 | 36 | 38 | 38 | 38 | 30 or less |
| Solder Heat Resistance | G | G | G | G | G | G | G | G |
| Warpage (mm) | 0.0 | 0.5 | 0.0 | 0.0 | 2.0 | 0.5 | 20 mm or more | 0.0 |

Abbreviation:
Ex. stands for Example;
Com. Ex. stands for Comparative Example;
G stands for Good;
U stands for Unsatisfactory; and
P stands for Poor.

Comparative Examples 6 to 9

Preparation of Photosensitive Resin Composition

A synthetic resin, which was obtained in any one of Comparative Synthesis Examples 1 to 4, a (B) thermosetting resin, a (C) photosensitive resin, a (D) photopolymerization initiator, and other components were mixed to prepare a photosensitive resin composition. Respective amounts of constituent raw materials in terms of a resin solid content, and types of the constituent raw materials are shown in Table 5. In Table 5, the amount of 1,2-bis(2-methoxyethoxy) ethane as a solvent indicates a total amount of solvent including a solvent contained in the synthetic resin solution and the like. The mixed solution was set in a defoaming device so that the solution was completely defoamed. A resultant solution was evaluated in the same manner as Example 5. Evaluation results are shown in Table 4.

TABLE 5

| | | Unit: Part by Weight | | | |
|---|---|---|---|---|---|
| Component | | Com. Ex. 6 | Com. Ex. 7 | Com. Ex. 8 | Com. Ex. 9 |
| (A) | Resin C | 60.0 | — | — | — |
| | Resin D | — | 60.0 | — | — |
| | Resin E | — | — | 60.0 | — |
| | Resin F | — | — | — | 60.0 |
| (B) | N-665-EXP <1> | 10.0 | 10.0 | 10.0 | 10.0 |
| | NC-3000H <2> | — | — | — | — |
| | OXT-121 <3> | — | — | — | — |
| (C) | A-9300 <4> | 3.0 | 3.0 | 3.0 | 3.0 |
| | BPE-1300 <5> | 12.0 | 12.0 | 12.0 | 12.0 |
| (D) | IRGACURE 819 <6> | 2.0 | 2.0 | 2.0 | 2.0 |
| Others | Barium Sulfate | 12.0 | 12.0 | 12.0 | 12.0 |
| | Aerosil R-974 <7> | 1.0 | 1.0 | 1.0 | 1.0 |
| | 1,2-bis(2-methoxyethoxy)ethane | 50 | 50 | 50 | 50 |
| | Solid Content Concentration of Photosensitive Resin Composition Solution | 66.6 | 66.6 | 66.6 | 66.6 |

<1> Cresol novolac type polyfunctional epoxy resin, trade name: EPICLON N-665-EXP, manufactured by Dainippon Ink and Chemicals
<2> Biphenyl novolac type polyfunctional epoxy resin, trade name: NC-3000H, manufactured by Nippon Kayaku Co., Ltd.
<3> Oxetane resin, trade name: Aron Oxetane OXT-121, manufactured by Toagosei Co., Ltd.
<4> Ethoxylated isocyanuric acid triacrylate, trade name: NK ester A-9300, manufactured by Shin-Nakamura Chemical Co., Ltd.
<5> Bisphenol A EO-denatured diacrylate, trade name: NK ester BPE-1300, manufactured by Shin-Nakamura Chemical Co., Ltd.
<6> Product manufactured by CIBA specialty chemicals Inc.: Photopolymerization initiator
<7> Product manufactured by Nippon AEROSIL Co., Ltd.: Silica particles

REFERENCE SIGNS LIST

1 Polyimide Film Including Photosensitive Resin Composition Thereon
2 Warpage Amount
3 Flat and Smooth Table

The invention claimed is:

1. A resin composition solution obtained by dissolving, in an organic solvent, a thermosetting resin composition containing at least:
   a (A) urethane imide oligomer having a terminal carboxylic acid group; and
   a (B) thermosetting resin
   wherein:
   the (A) urethane imide oligomer having a terminal carboxylic acid group is obtained by:
   (i) reacting at least a (a) diol compound and a (b) diisocyanate compound so as to synthesize a terminal isocyanate compound;
   (ii) reacting the terminal isocyanate compound with a (c) tetracarboxylic acid dianhydride so as to synthesize a urethane imide oligomer having a terminal acid anhydride; and
   (iii) reacting the urethane imide oligomer having a terminal acid anhydride with (d) water, the (a) diol compound being represented by General Formula (1):

 (1)

wherein R represents a divalent organic group; and l represents an integer of 1 to 20,

 (2)

the (b) diisocyanate compound being represented by General Formula (2):
wherein X represents a divalent organic group, and
the (c) tetracarboxylic acid dianhydride being represented by General Formula (3):

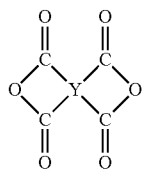 (3)

wherein Y represents a tetravalent organic group;
wherein the (A) urethane imide oligomer having a terminal carboxylic acid group is a tetracarboxylic acid urethane imide oligomer,
wherein the (a) diol compound contains at least a polycarbonate diol represented by General Formula (4):

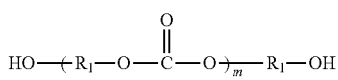 (4)

wherein each $R_1$ independently represents a divalent organic group; and m represents an integer of 1 to 20,
wherein the resin composition solution having a solute concentration of 60% by weight or more and 90% by weight or less, and
wherein the resin composition solution has a viscosity of not less than 180 poise and not more than 250 poise at 23° C.

2. The resin composition solution as set forth in claim 1, wherein the (B) thermosetting resin is contained in the resin composition solution by 1 to 100 parts by weight, relative to 100 parts by weight of the (A) urethane imide oligomer having a terminal carboxylic acid group.

3. A photosensitive resin composition containing at least:
a resin composition solution as set forth in claim 1;
a (C) photosensitive resin; and
a (D) photopolymerization initiator.

4. The photosensitive resin composition as set forth in claim 3, wherein:
the (A) urethane imide oligomer having a terminal carboxylic acid group, the (B) thermosetting resin, the (C) photosensitive resin, and the (D) photopolymerization initiator are contained in the photosensitive resin composition in such an amount ratio that the (C) photosensitive resin and the (D) photopolymerization initiator are contained therein respectively by 10 to 200 parts by weight and by 0.1 to 50 parts by weight, relative to 100 parts by weight of a total solid content of the (A) urethane imide oligomer having a terminal carboxylic acid group and the (B) thermosetting resin.

5. A resin film obtained by applying, to a surface of a base material, a resin composition solution as set forth in claim 3 and then drying the resin composition solution thus applied.

6. An insulating film obtained by curing a resin film as set forth in claim 5.

7. A printed wiring board provided with an insulating film, wherein:
the insulating film is an insulating film as set forth in claim 6; and
the printed wiring board is covered with the insulating film.

8. A resin composition solution obtained by dissolving, in an organic solvent, a photosensitive resin composition as set forth in claim 3.

9. A resin film obtained by applying, to a surface of a base material, a resin composition solution as set forth in claim 8 and then drying the resin composition solution thus applied.

10. An insulating film obtained by curing a resin film as set forth in claim 9.

11. A printed wiring board provided with an insulating film, wherein:
the insulating film is an insulating film as set forth in claim 10; and
the printed wiring board is covered with the insulating film.

12. The resin composition solution as set forth in claim 1, wherein the (A) urethane imide oligomer having a terminal carboxylic acid group further has a carboxyl group in its side chain.

* * * * *